US012608135B2

(12) United States Patent
Park et al.

(10) Patent No.: US 12,608,135 B2
(45) Date of Patent: Apr. 21, 2026

(54) RECOVERY OPERATION APPLYING A RECOVERY VOLTAGE VIA WAKE-UP PULSE FOR INCREASING A RESIDUAL POLARIZATION OF MEMORY CELLS

(71) Applicant: SK hynix Inc., Gyeonggi-do (KR)

(72) Inventors: Gyeongcheol Park, Gyeonggi-do (KR); Minchul Sung, Gyeonggi-do (KR); Seiyon Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 324 days.

(21) Appl. No.: 17/976,481

(22) Filed: Oct. 28, 2022

(65) Prior Publication Data

US 2023/0384941 A1      Nov. 30, 2023

(30) Foreign Application Priority Data

May 30, 2022      (KR) ........................ 10-2022-0066087

(51) Int. Cl.
    *G06F 3/06*        (2006.01)
    *G11C 5/14*       (2006.01)

(52) U.S. Cl.
    CPC .......... *G06F 3/0619* (2013.01); *G06F 3/0629* (2013.01); *G06F 3/0673* (2013.01); *G11C 5/148* (2013.01)

(58) Field of Classification Search
None
See application file for complete search history.

(56) References Cited

U.S. PATENT DOCUMENTS

| | | | |
|---|---|---|---|
| 6,545,902 B2 | 4/2003 | Sakata et al. | |
| 10,002,666 B2 | 6/2018 | Kajigaya | |
| 10,410,737 B2 | 9/2019 | Mariani et al. | |
| 10,706,906 B2 | 7/2020 | Calderoni et al. | |
| 2007/0237016 A1* | 10/2007 | Miyamoto | .............. G11C 11/22 365/222 |

(Continued)

FOREIGN PATENT DOCUMENTS

| | | |
|---|---|---|
| KR | 10-0220950 B1 | 9/1999 |
| KR | 10-2054631 B1 | 12/2019 |
| KR | 10-2021-0036283 A | 4/2021 |

OTHER PUBLICATIONS

Xiaoming Yang et al., Lead titanate-induced abnormal ferroelectric/ antiferroelectric phase transitions in Pb (Lu0.5Nb0.5)O3 solid solutions, Materials & Design vol. 183, Dec. 5, 2019, pp. 1-9, Elsevier, Netherlands.

(Continued)

*Primary Examiner* — Khoa D Doan
*Assistant Examiner* — Marwan Ayash
(74) *Attorney, Agent, or Firm* — IP & T GROUP LLP

(57) ABSTRACT

A memory device includes a memory cell array including a plurality of memory cells; a peripheral circuit configured to perform a recovery operation of applying a recovery voltage to the memory cells for increasing a residual polarization of the memory cells and configured to perform a normal operation of applying a driving voltage to the memory cells for reading data from the memory cells or writing data into the memory cells; and a control logic configured to control, when powered up, the peripheral circuit to perform the recovery operation and then perform the normal operation.

8 Claims, 19 Drawing Sheets

(56)　　　　　　References Cited

U.S. PATENT DOCUMENTS

| 2014/0146627 | A1 * | 5/2014 | Cho | ........................ | G11C 7/12 |
| | | | | | 365/202 |
| 2018/0166151 | A1 * | 6/2018 | Mariani | ................. | G11C 29/42 |
| 2018/0358076 | A1 * | 12/2018 | Calderoni | ........... | G11C 11/2293 |
| 2021/0090641 | A1 * | 3/2021 | Strand | ................. | G11C 11/2273 |

OTHER PUBLICATIONS

M. Sung et al., Low Voltage and High Speed 1Xnm 1T1C FE-RAM with Ultra-Thin 5nm HZO, International Electron Devices Meeting (IEDM), 2021, pp. 33.3.1-33.3.4, IEEE, USA.
Milan Pesic et al., Physical Mechanisms behind the Field-Cycling Behavior of HfO2-Based Ferroelectric Capacitors, Advanced Functional Materials, vol. 26—Issue 25, May 6, 2016, pp. 4601-4612, Wiley-VCH, Germany, https://onlinelibrary.wiley.com/doi/abs/10.1002/adfm.201600590.

* cited by examiner

START

Power-up ── S410

Perform recovery operation ── S420

Perform normal operation ── S430

END

START

Perform backup operation — S710

Perform recovery voltage application operation — S720

Perform write-back operation — S730

END

S720

START

S724
Select next word line

S721
Activate selected word line

S722
Apply recovery voltage to memory cells coupled to activated word line through at least one of bit lines S723
Last word line?

NO

YES

END

RECOVERY OPERATION APPLYING A RECOVERY VOLTAGE VIA WAKE-UP PULSE FOR INCREASING A RESIDUAL POLARIZATION OF MEMORY CELLS

CROSS-REFERENCE TO RELATED APPLICATION

The present application claims the benefit of Korean Patent Application No, 10-2022-0066087, filed on May 30, 2022, which is incorporated herein by reference in its entirety.

BACKGROUND

1. Field

Various embodiments of the present invention relate to a semiconductor design technology, and more particularly, to a recovery operation of applying a wake-up pulse to a memory device.

2. Description of the Related Art

Memory devices may be classified into volatile and nonvolatile memory devices. The non-volatile memory devices perform a read/write operation at a relatively lower speed than volatile memory devices but retain stored data even when a power supply is cut off. Accordingly, the non-volatile memory devices are frequently used in portable electronic devices for storing data which need to be retained regardless of whether or not power is supplied to the device.

Examples of the non-volatile memory devices include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FeRAM), and the like.

SUMMARY

According to an embodiment of the present invention, a memory device includes a memory cell array including a plurality of memory cells; a peripheral circuit configured to perform a recovery operation of applying a recovery voltage to the memory cells for increasing a residual polarization of the memory cells and configured to perform a normal operation of applying a driving voltage to the memory cells for reading data from the memory cells or writing data into the memory cells; and a control logic configured to control, when powered up, the peripheral circuit to perform the recovery operation and then perform the normal operation.

According to an embodiment of the present invention, an operating method of a memory device includes performing, when powered up, a recovery operation including applying a recovery voltage to a plurality of memory cells for increasing a residual polarization of the memory cells; and performing, after the recovery operation, a normal operation of applying a driving voltage to the memory cells for reading data from the memory cells or writing data into the memory cells.

According to an embodiment of the present invention, an operating method of a memory device includes applying, while securing data stored in an array of ferroelectric memory cells, an isolated and unipolar recovery pulse to each column of the array to recover residual polarization of the respective memory cells; and applying a driving pulse to the array to access the array, wherein a level of the driving puke is not lower than the recovery pulse, and wherein the recovery puke is wider than the driving pulse.

According to embodiments of the present invention, the ferroelectric memory device may ensure reliability of an operation thereof by performing a normal operation in a state in which target characteristics may be ensured by performing a recovery operation during an initial operation.

According to embodiments of the present invention, the ferroelectric memory device may minimize power consumption by performing a recovery operation using a unipolar wake-up puke having an amplitude substantially equal to or lower than a driving voltage. In addition, since it is not necessary to generate a voltage higher than the driving voltage, a separate voltage generation circuit is not required, so it is possible to expect an improvement in the integration of the memory device.

According to embodiments of the present invention, the ferroelectric memory device may utilize more charges as polarization of up-state available within a driving voltage range increases, thereby reducing failure due to a capacitor defect in a wafer test to improve yield and increase durability and data retention time of the device.

According to embodiments of the present invention, the ferroelectric memory device may reduce the burden placed on the process and further secure mass production by securing a desired capacitor capacity even in a ferroelectric memory device having a thinner dielectric film.

BRIEF DESCRIPTION OF THE DRAWINGS

FIG. 4 is a flow chart for describing an operation of a memory device in accordance with an embodiment of the present invention.

DETAILED DESCRIPTION

Figure 1A:
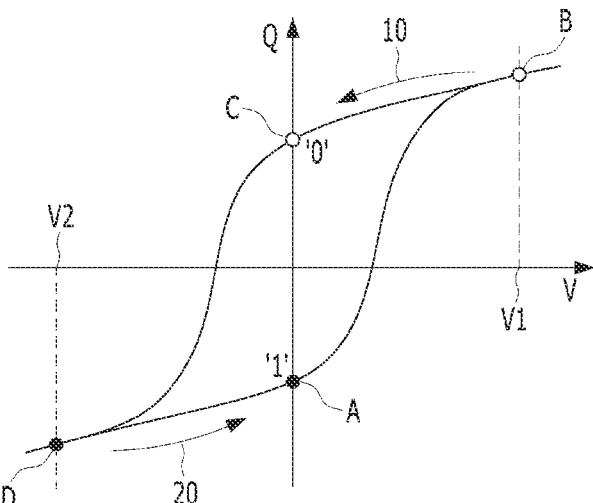
FIGS. 1A and 1B are graphs showing hysteresis loop characteristics of a general ferroelectric.

Specific structural and functional descriptions provided herein are directed to embodiments of the present disclosure. The present invention, however, is not limited to the embodiments described herein.

While embodiments are described in detail, the present invention is not limited to any specific detail. The present disclosure may be embodied in many different forms and should not be construed as being limited to any specific description. Rather, the present invention should be construed to cover not only the disclosed embodiments, but also various alternatives, modifications, equivalents, and other embodiments that fall within the spirit and scope of the present disclosure.

It will be understood that, although the terms "first", "second", etc. may be used herein to identify various elements, these elements should not be limited by these terms. These terms are only used to distinguish one element from another element that otherwise have the same or similar names. A first element in one instance could be termed a second element in another instance without departing from the teachings of the present disclosure.

It will be understood that when an element is referred to as being "coupled" or "connected" to another element, it can be directly coupled or connected to the other element or one or more intervening elements may be present therebetween. In contrast, it should be understood that when an element is referred to as being "directly coupled" or "directly connected" to another element, there are no intervening elements present. Other expressions that describe the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that open ended terms, such as "comprise", "include", "have", etc., when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and not be interpreted in an idealized or overly formal sense unless expressly so defined herein.

Detailed description of functions and structures well known to those skilled in the art may be omitted to avoid obscuring the subject matter of the present disclosure. This aims to omit unnecessary description to make the subject matter of the present disclosure clear.

Various embodiments of the present disclosure are described more fully below with reference to the accompanying drawings, in which preferred embodiments of the present disclosure are shown, so that those skilled in the art can easily carry out and practice the present disclosure.

A ferroelectric memory device (FeRAM) is attracting attention as a next-generation memory device due to its data processing speed of Dynamic RAM (DRAM) and non-volatile characteristics in which data is preserved even when power is turned off. A ferroelectric memory device (FeRAM) has a structure almost similar to that of a DRAM, and uses a ferroelectric having high residual polarization as a material of a cell capacitor, thereby implementing characteristics in which data is not erased even when an electric field is removed.

Figure 1B:
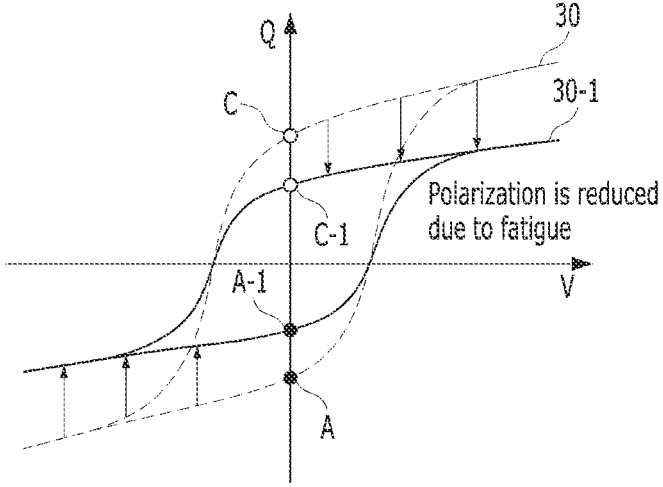

FIG. 1A is a graph showing the hysteresis loop characteristics of a general ferroelectric in an initial state, and FIG. 1B is a graph showing the hysteresis loop characteristics of the general ferroelectric in a fatigue state, FIGS. 1A and 1B show charge amount (Q) stored in a ferroelectric capacitor in accordance with a voltage (V).

Referring to FIG. 1A, it may be seen that the charge amount Q is proportional to the polarization of the ferroelectric, and the polarization induced by the electric field is maintained in a predetermined amount (at a state A and a state C) without being extinguished due to the presence of residual polarization or spontaneous polarization even when the electric field is removed. Hereinafter, a case where the state A corresponds to a logic high level and the state C corresponds to a logic low level will be described as an example.

Electric charge may be charged until a positive voltage V1 is applied to the ferroelectric capacitor to reach a state B. As the positive voltage V1 is removed, the state B follows a path 10 until the state C corresponding to the logic low level is reached. Likewise, electric charges may be charged until the ferroelectric capacitor reaches a state D by applying a negative voltage V2. As the negative voltage V2 is removed, the state D follows a path 20 until the state A corresponding to the logic high level is reached. The charged state (i.e., the state A and the state C) may also be referred to as a residual polarization value, that is, a polarization (or charge) remaining when an external bias (e.g., voltage) is removed.

Meanwhile, the ferroelectric may experience fatigue according to a normal operation such as a read or write operation performed in a memory cell. The ferroelectric in the fatigue state may reduce the ability of the memory cell, which may make the memory cell inoperable. Accordingly, a method for increasing and recovering the polarization characteristics of the ferroelectric by applying a wake-up pulse to the ferroelectric memory device in the fatigue state has been proposed.

Referring to FIG. 1B, a hysteresis loop (solid line) of a ferroelectric in a fatigue state compared to a hysteresis loop (broken line) of a ferroelectric in an initial state is illustrated. The hysteresis loop of the ferroelectric in the fatigue state has a lower residual polarization (i.e., denoted as charged states A-1 and C-1) compared to the residual polarization (i.e., denoted as charged states A and C) of the hysteresis loop of the ferroelectric in the initial state.

The residual polarization may be reduced according to an access operation applied to a ferroelectric memory cell (i.e., a read or write operation, hereinafter referred to as a normal operation), or the number of access operations. Accordingly, the ferroelectric may be in the fatigue state. That is, as the normal operation is performed, that is, as the fatigue is accumulated in the ferroelectric memory cell, the two charged states (the state A-1 and the state C-1) of the hysteresis loop of the ferroelectric may be continuously reduced in size. Accordingly, a difference between two charged states (the state A-1 and the state C-1) may be reduced, and an error in a sensing operation for detecting a logic level of data stored in the ferroelectric memory cell may occur.

Therefore, a recovery operation to improve/restore the residual polarization and increase the stored charge may be performed throughout the ferroelectric in the fatigue state. For example, a wake-up pulse of a specific voltage level may be applied to a fatigue ferroelectric to increase the residual polarization from the charged states A-1 and C-1 to the charged states A and C, respectively, That is, the hysteresis loop in the fatigue state may be restored to the hysteresis loop in the initial state.

On the other hand, when a bipolar pulse is used as a wake-up pulse, a voltage higher than an existing driving voltage range is applied, and thus reliability of a dielectric of a cell capacitor is degraded due to high power consumption and high voltage application. In addition, the residual polarization that increases through the bipolar pulse of ±1V is only about 50%, and thus does not show much effect. In addition, when it is aimed at operating at lower power, driving a pulse with a high voltage requires high power consumption, which greatly undermines the advantage of saving power by utilizing a nonvolatile memory device.

Furthermore, hafnium oxide-based dielectric material or zirconium oxide-based dielectric material exhibits the strongest ferroelectric at about 10 nm level, and at a thickness below that, the ferroelectric may be weakened to increase an anti-ferroelectric or have a pinched hysteresis in an intermediate state between the ferroelectric and the anti-ferroelectric, Currently, as a minimum wiring width (Feature Size) of the memory is continuously decreased, the thickness of the dielectric layer is also decreasing. Accordingly, it is gradually difficult to secure the ferroelectric using hafnium oxide-based material or zirconium oxide-based material.

Hereinafter, a method of performing a recovery operation of applying a unipolar wake-up pulse of a driving voltage level to ferroelectric memory cells when powered up according to an embodiment of the present invention will be described.

Figure 2:
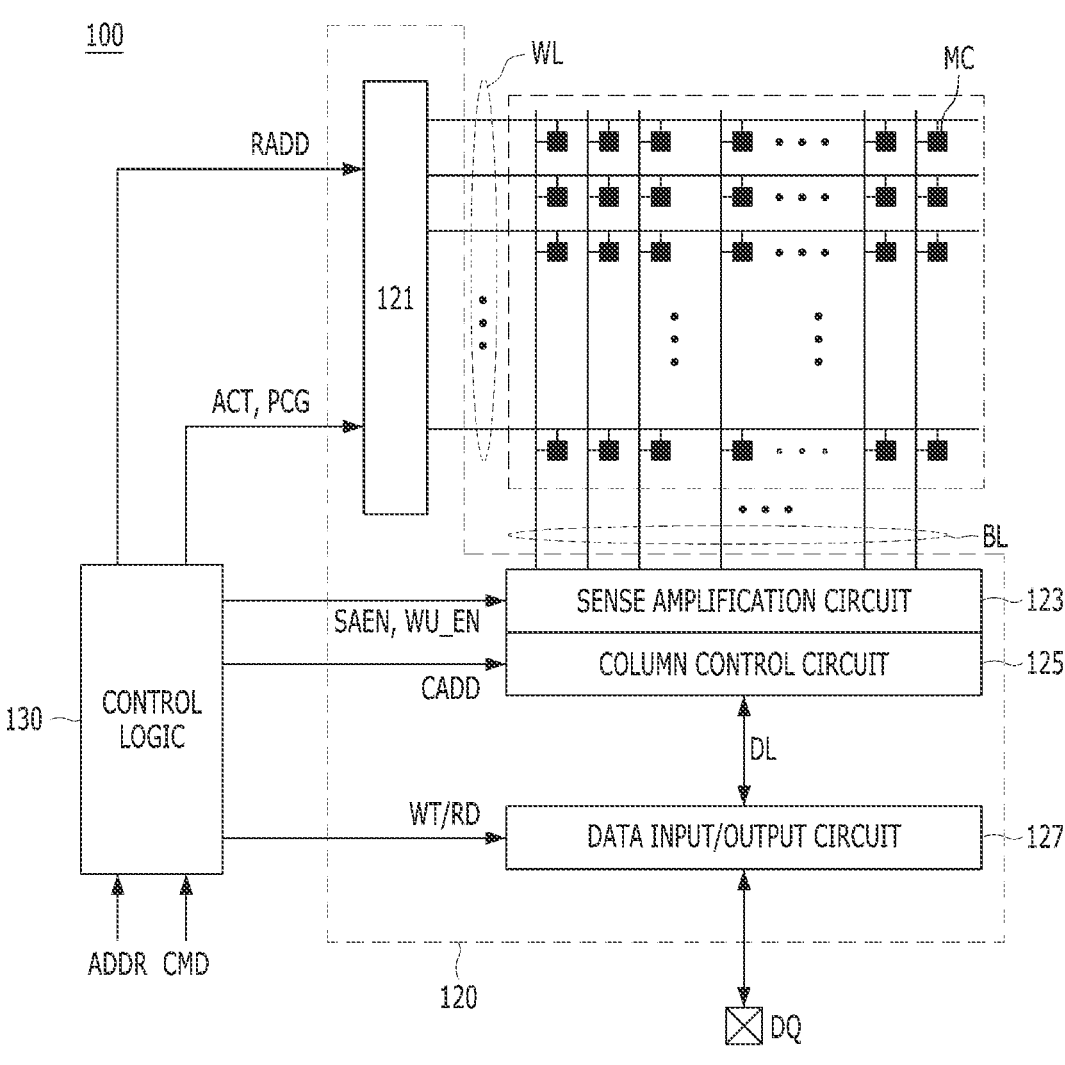
FIG. 2 is a block diagram illustrating a memory device in accordance with an embodiment of the present invention.

FIG. 2 is a block diagram illustrating a memory device 100 in accordance with an embodiment of the present invention.

Referring to FIG. 2, the memory device 100 may include a memory cell array 110, a peripheral circuit 120, and a control logic 130.

The memory cell array 110 may include a plurality of memory cells MC. According to an embodiment, a plurality of memory cells MC may be nonvolatile memory cells. In particular, the plurality of memory cells MC may be composed of ferroelectric memory cells. Since the ferroelectric memory cells have naturally generated electrical polarization, they may have non-zero polarization even when an electric field is removed. Each of the memory cells MC may be arranged in a matrix form between a plurality of rows (i.e., word lines WL) and a plurality of columns (i.e., bit lines BL). According to an embodiment, each of the plurality of rows may be composed of at least one word line, at least one plate line and/or at least one source line.

The peripheral circuit 120 may drive the memory cell array 110 under the control of the control logic 130. For example, the peripheral circuit 120 may select specific memory cells of the memory cell array 110 by applying various voltages to the word lines WL and the bit lines BL under the control of the control logic 130, and perform a normal operation such as a read or write operation to the selected memory cells. That is, the normal operation may include an access operation of accessing the selected memory cells according to the driving voltages applied to the memory cells through the word lines WL and the bit lines BL during the read or write operation.

Meanwhile, as described with reference to FIGS. 1A and 1B, in the ferroelectric memory cell, the polarization may be reduced and stored charges may be reduced due to the fatigue according to the normal operation such as the read or write operation. Accordingly, the peripheral circuit 120 may perform a recovery operation for increasing the residual polarization of the ferroelectric memory cells by applying a recovery voltage to the ferroelectric memory cells MC through the word lines WL and/or the bit lines BL of the memory cell array 110. Particularly, in an embodiment of the present invention, the peripheral circuit 120 may perform a recovery operation before performing a normal operation when powered up according to the control of the control logic 130, and the recovery voltage used during the recovery operation may have a voltage level substantially equal to or lower than a driving voltage applied to the ferroelectric memory cells MC during the normal operation.

Meanwhile, before the recovery operation is performed, the peripheral circuit 120 may perform a backup operation of writing data previously stored in the memory cells MC of the memory cell array 110 into a plurality of spare cells of another memory cell array under the control of the control logic 130. Also, after the recovery operation is performed, the peripheral circuit 120 may perform a write-back operation of writing the data backed up to the spare cells of another memory cell array back to the memory cells MC of the memory cell array 110 under the control of the control logic 130.

More specifically, the peripheral circuit 120 may include a row control circuit 121, a sense amplification circuit 123, a column control circuit 125, and a data input/output circuit 127.

The row control circuit 121 may be coupled to the memory cells MC of the memory cell array 110 through the word lines WL. The row control circuit 121 may operate in response to the control of the control logic 130. The row control circuit 121 may receive a row address RADD, an active command ACT, and a precharge command PCG from the control logic 130. The row control circuit 121 may decode the row address RADD to select any one of the word lines WL. The row control circuit 121 may activate the selected word line according to the active command ACT and deactivate the activated word line according to the precharge command PCG. For example, the row control circuit 121 may apply a high voltage VPP higher than a power supply voltage (VDD) level to the selected word line to activate the word line. According to an embodiment, the row control circuit 121 may include an address buffer, a row decoder, a voltage generation circuit, and the like, Meanwhile, the row control circuit 121 may additionally drive a source line or a plate line of the memory cell array 110 under the control of the control logic 130.

The sense amplification circuit 123 may be coupled to the memory cells MC of the memory cell array 110 through the bit lines BL. The sense amplification circuit 123 may operate in response to the control of the control logic 130. The sense amplification circuit 123 may receive a sensing control signal SAEN and a wake-up signal WU_EN from the control logic 130. The sense amplification circuit 123 may include a plurality of bit line sense amplifiers coupled to a pair of bit lines BL and BLB, respectively. Each of the bit line sense amplifiers may sense and amplify a voltage difference between a bit line BL and a complementary bit line BLB corresponding to the sensing control signal SAEN. In particular, in an embodiment of the present invention, each of the bit line sense amplifiers may apply the recovery voltage to at least one of the bit line BL and the complementary bit line BLB in response to the wake-up signal WU_EN.

The column control circuit 125 may operate in response to the control of the control logic 130. The column control circuit 125 may receive a column address CADD from the control logic 130. The column control circuit 125 may decode the column address CADD to select some bit lines among the bit lines BL and transmit data between the selected bit lines and the data input/output circuit 127. The column control circuit 125 may exchange data with the data input/output circuit 127 through data lines DL. For example, the column control circuit 125 may transfer data read from the bit lines BL to the data input/output circuit 127 through the data lines DL, or transfer data provided from the data input/output circuit 127 through the data lines DL to the bit lines BL. According to an embodiment, the column control circuit 122 may include a column decoder.

The data input/output circuit 127 may exchange data with an external device (e.g., a memory controller or a test device) through a data pad DQ. The data input/output circuit 127 may operate in response to the control of the control logic 130. The data input/output circuit 127 may receive a read command RD or a write command WT from the control logic 130. During the read operation, the data input/output circuit 127 may output data transmitted through the data lines DL to the data pad DQ in response to the read command RD. During the write operation, the data input/output circuit 127 may receive data provided from the external device through the data pad DQ in response to the write command WT.

The control logic 130 may control all operations of the memory device 100. The control logic 130 may receive a command CMD and an address ADDR from the external device. The control logic 130 may generate the row address RADD, the column address CADD, the active command ACT, the precharge command PCG, the read command RD, the write command WT, the sensing control signal SAEN, and the wake-up signal WU_EN to control the peripheral circuit 120. The control logic 130 may buffer and decode the address ADDR and output the row address RADD and the column address CADD. The control logic 130 may decode the command CMD to generate the active command ACT, the precharge command PCG, the read command RD, the write command WT, the sensing control signal SAEN, and the wake-up signal WU_EN. The control logic 130 may generate a sensing control signal SAEN that is activated in response to the active command ACT and deactivated in response to the precharge command PCG. According to an embodiment of the present invention, the control logic 130 may generate the sensing control signal SAEN and the wake-up signal WU_EN that are activated for a predetermined period before the normal operation when powered up.

According to an embodiment, the control logic 130 may control the wake-up signal WU_EN to pulse at least once.

FIGS. 3A to 3D are diagrams illustrating a structure of a memory cell MC of FIG. 2 in accordance with an embodiment of the present invention.

Figure 3A:
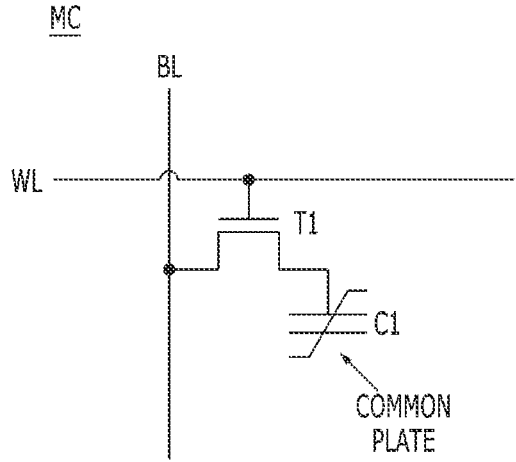
FIGS. 3A to 3D are diagrams illustrating a structure of a memory cell of FIG. 2 in accordance with an embodiment of the present invention.

Referring to FIG. 3A, the memory cell MC may include an access transistor T1 and a ferroelectric capacitor C1. That is, each memory cell MC has a configuration of 1T/1C in which a cell storing 1-bit is composed of one transistor and one capacitor. The ferroelectric capacitor C1 may include a first electrode coupled to a common plate. The access transistor T1 may be coupled between a second electrode of the ferroelectric capacitor C1 and a bit line BL and may have a gate coupled to a word line WL.

The ferroelectric memory cell MC may store a logic state (i.e., data '1' or data '0') based on electrical polarization of the ferroelectric capacitor C1. A ferroelectric based on silicon, hafnium oxide, zirconium oxide, and hafnium zirconium oxide may be formed between the first and second electrodes of the ferroelectric capacitor C1. Alternatively, a ferroelectric based on a Perovskite-based piezoelectric material such as BaTiO3, SrTiO3, PbZrTiO, etc. may be formed between the first and second electrodes of the ferroelectric capacitor C1. When a voltage is applied to the second electrode of the ferroelectric capacitor C1, the ferroelectric is polarized in the electric field direction. A switching threshold for changing the polarization state of the ferroelectric capacitor C1 is referred to as a coercive voltage. The ferroelectric capacitor C1 shows the hysteresis loop characteristics described in FIGS. 1A and 1B, and a current corresponding to the polarization state flows to the ferroelectric capacitor C1. If the voltage applied to the ferroelectric capacitor C1 is greater than the coercive voltage, the ferroelectric capacitor C1 changes polarization states in accordance with the polarity of the applied voltage. The polarization state of the ferroelectric capacitor C1 is maintained even after power is removed. Due to such polarization characteristics, the ferroelectric memory device exhibits characteristics as a nonvolatile memory.

Figure 3B:
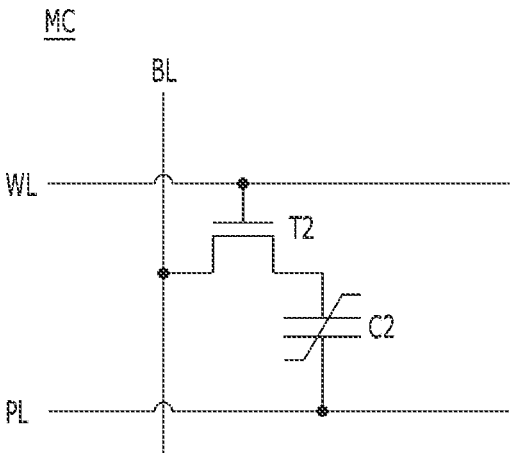

Referring to FIG. 3B, the ferroelectric memory cell MC may include an access transistor T2 and a ferroelectric capacitor C2, Like FIG. 3A, the ferroelectric memory cell MC has a configuration of 1T/1C. The ferroelectric capacitor C2 may include the same configuration as the ferroelectric capacitor C1 of FIG. 3A. The ferroelectric capacitor C2 may include a first electrode coupled to a plate line PL. The access transistor 12 may be coupled between a second electrode of the ferroelectric capacitor C2 and a bit line BL and may have a gate coupled to a word line WL. In this case, the row control circuit 121 may control a row line consisting of a word line WL and a plate line PL per one memory cell. The ferroelectric memory cells MC illustrated in FIG. 3B may have independent plates but may have an array shape coupled through a plate line PL.

Figure 3C:
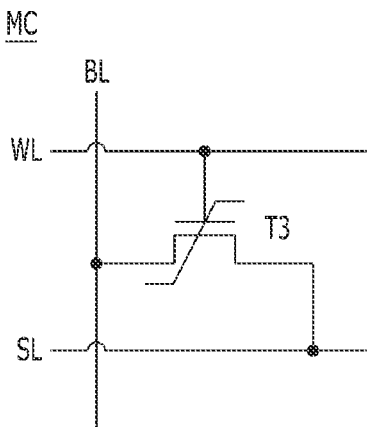

Referring to FIG. 3C, the ferroelectric memory cell MC may include a single transistor T3 coupled between a source line SL and a bit line BL and having a gate coupled to a word line WL. In this case, a ferroelectric may be used as a dielectric material of the gate in the memory cell MC. The ferroelectric may include the same material as the ferroelectric of the ferroelectric capacitor C1 of FIG. 3A.

Figure 3D:
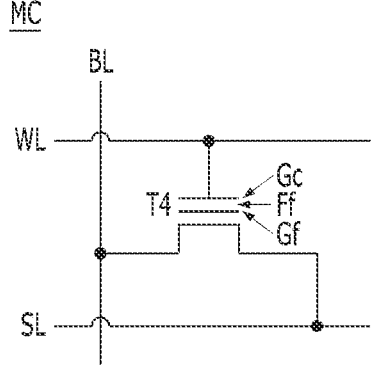

Referring to FIG. 3D, the ferroelectric memory cell MC may include a single transistor T4 coupled between a source line SL and a bit line BL and having a gate coupled to a word line WL. In this case, the gate of the transistor T4 may include a floating gate electrode Gf, a dielectric material Ff, and a control gate electrode Gc, and a ferroelectric may be used as the dielectric material Ff. The dielectric material Ff may include the same material as the ferroelectric of the ferroelectric capacitor C1 of FIG. 3A.

Figure 4:
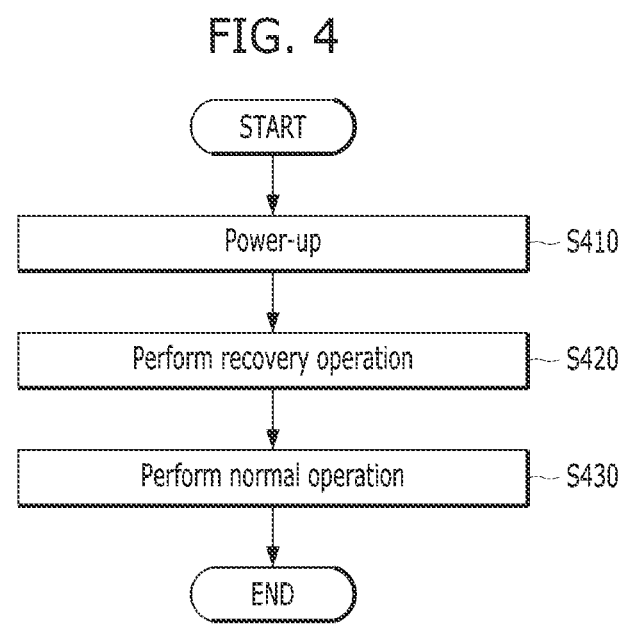

FIG. 4 is a flow chart for describing an operation of the memory device 100 in accordance with an embodiment of the present invention.

Referring to FIG. 4, the memory device 100 may be initialized when powered up (at S410). Since the memory device 100 has a nonvolatile characteristic in which data is preserved even when power is turned off, the memory device 100 may be in a fatigue state at the power-up.

Thereafter, the memory device 100 may perform a recovery operation of applying a recovery voltage to increase residual polarization of the ferroelectric memory cells MC (at S420).

The memory device 100 may perform the recovery operation using the recovery voltage having a voltage level substantially equal to or lower than that of a driving voltage applied to the ferroelectric memory cells MC during a read or write operation. For example, the recovery voltage may correspond to a voltage applied to the ferroelectric of the ferroelectric memory cells MC, a voltage (or a potential difference) applied between both electrodes of the ferroelectric capacitors C1 and C2 of FIGS. 3A and 3B, a voltage applied to the gate of the single transistor T3 of FIG. 3C, and a voltage applied to a floating gate Gf of FIG. 3D. That is, in an embodiment of the present invention, the recovery voltage may be applied to the ferroelectric of the ferroelectric memory cells MC through the bit lines BL. Preferably, the recovery voltage may include a unipolar wake-up pulse, According to an embodiment, the recovery voltage may be configured as a one-time unipolar wake-up pulse that is pulsing once with a constant voltage during a recovery operation period. In this case, a pulse width of the recovery voltage may have a width wider than that of the driving voltage.

Thereafter, the memory device 100 may perform a normal operation such as a read or write operation (at S430).

In the read operation, the memory device 100 may select one of the word lines WL according to the row address RADD and activate the selected word line. Thereafter, the bit line sense amplifiers of the memory device 100 may sense and amplify a voltage difference between the bit lines BL and BLB coupled to the ferroelectric memory cells MC that are coupled to the activated word line, in response to the sensing control signal SAEN. The memory device 100 may output data transmitted from bit lines selected according to the column address CADD to the external device through the data pad DQ, according to the read command RD.

In the write operation, the memory device 100 may select one of the word lines WL according to the row address RADD and activate the selected word line. The memory device 100 may receive data provided from the external device through the data pad DQ in response to the write command WT, and transmit the data to the bit lines BL and BLB selected according to the column address CADD, The bit line sense amplifiers may sense and amplify data applied to the bit lines BL and BLB in response to the sensing control signal SAEN and write the sensed data to the ferroelectric memory cells coupled to the activated word line.

In the read or write operation, the memory device 100 may apply a high voltage VPP to the selected word line to activate the word line and apply a ground voltage VSS or a low voltage VBB to unselected word lines to deactivate the word lines. In addition, the memory device 100 may provide a bit line precharge voltage VBLP, a core voltage VCORE, and the ground voltage VSS as operating voltages to the bit line sense amplifiers, According to an embodiment, the memory device 100 may provide a power supply voltage VDD instead of the core voltage VCORE having a voltage level lower than the power supply voltage VDD. As described above, in the read or write operation, the memory device 100 may apply various driving voltages such as the high voltage VPP, the power voltage VDD, the core voltage VCORE, the bit line precharge voltage VBLP, the ground voltage VSS, and the low voltage VBB to the ferroelectric memory cells MC.

Figure 5A:
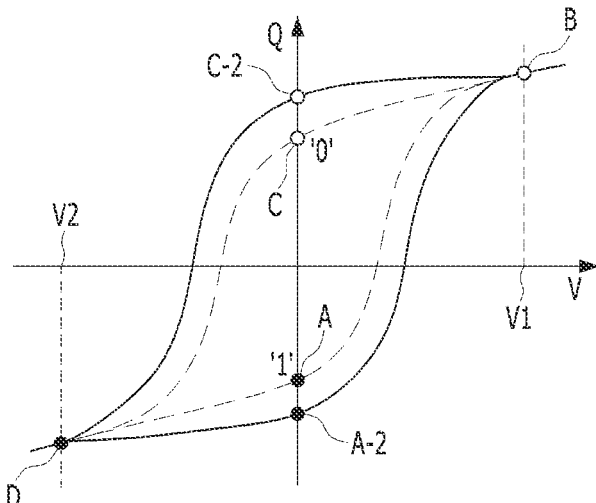
FIGS. 5A and 5B are graphs showing hysteresis loop characteristics of a ferroelectric in accordance with an embodiment of the present invention.
Figure 5B:
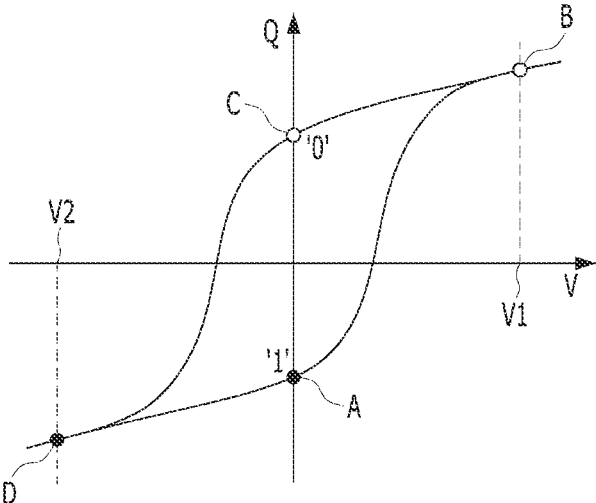

FIGS. 5A and 5B are graphs showing hysteresis loop characteristics of a ferroelectric in accordance with an embodiment of the present invention.

Referring to FIG. 5A, the hysteresis loop characteristics of the ferroelectric after the recovery operation is performed (at S420). As illustrated in FIG. 5A, compared to the hysteresis loop (broken line) of the ferroelectric in an initial state, the hysteresis loop (solid line) of the ferroelectric after the recovery operation is performed is illustrated. After the recovery operation is performed, the hysteresis loop of the ferroelectric has a higher residual polarization (i.e., denoted as charged states A-2 and C-2), compared to the residual polarization (i.e., denoted as charged states A and C) of the hysteresis loop of the ferroelectric in the initial state.

Referring to FIG. 5B, the hysteresis loop characteristics of the ferroelectric after the normal operation is performed (at S430). As shown in FIG. 5B, as the normal operation is performed, the fatigue is accumulated in the ferroelectric memory cell MC, Accordingly, the two charged states A-2 and C-2 of the hysteresis loop of the ferroelectric may be continuously reduced in size.

According to an embodiment of the present disclosure, the residual polarization may be increased in advance by performing the recovery operation before the normal operation. In such a state, even if the residual polarization is reduced as the normal operation is performed, the margin of the sensing operation is ensured due to the increased residual polarization in advance, thereby improving operation reliability.

FIGS. 6A to 6D are waveforms for describing a recovery operation and a normal operation of FIG. 4 in accordance with an embodiment of the present invention. In FIGS. 6A to 6D, potential differences between both electrodes of a ferroelectric of a memory cell during a recovery operation and a normal operation are shown.

Figure 6A:
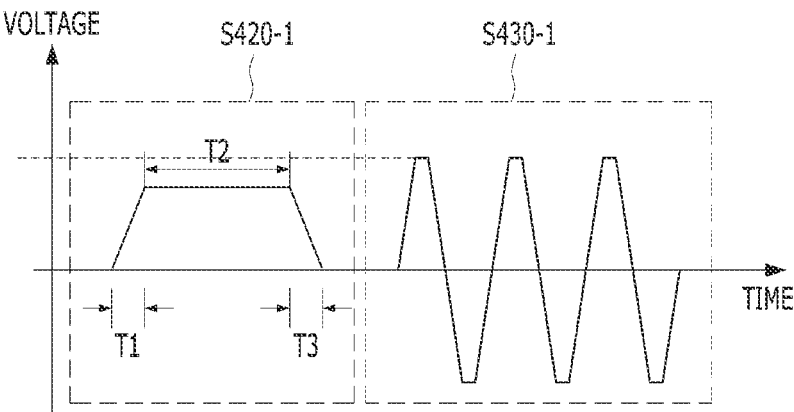
FIGS. 6A to 6D are waveforms for describing a recovery operation and a normal operation of FIG. 4 in accordance with an embodiment of the present invention.
Figure 6B:
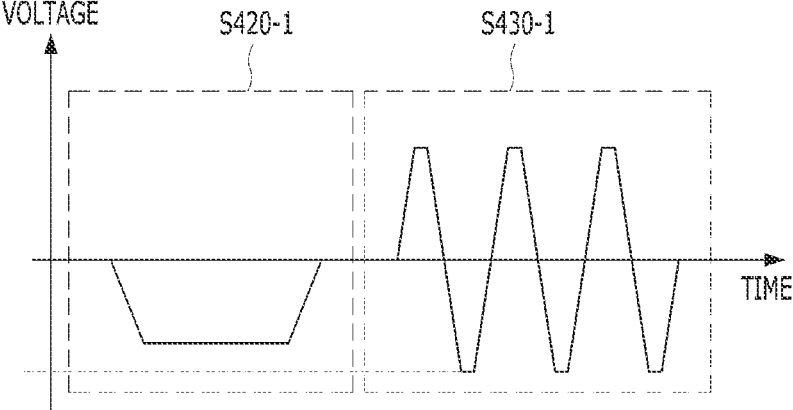

Referring to FIGS. 6A and 6B, a one-time unipolar wake-up pulse may be applied to a memory cell as a recovery voltage in a recovery operation (at S420-1), In this case, a positive or negative potential difference may occur between both electrodes of the ferroelectric in the memory cell. The wake-up pulse may be applied during a section composed of a time T1 (i.e., a rising time to reach a target voltage level (or the potential difference)), a time T2 (i.e., a pulse holding period corresponding to a pulse width), and a time 13 (i.e., falling time to reach a ground voltage level from the target voltage level (or the potential difference)). The pulse holding period T2 may be determined in consideration of the characteristics of the ferroelectric. For example, considering the pinched hysteresis characteristics of a hafnium zirconium oxide-based ferroelectric of 5 nm, the pulse holding period T2 may maintain a minimum of 10 us.

Thereafter, in the normal operation (at S430-1), a read or write operation may be performed using a driving voltage such as a high voltage VPP, a power voltage VDD, a core voltage VCORE, a bit line precharge voltage VBLP, a ground voltage VSS, and a low voltage VBB. Accordingly, a positive or negative potential difference may occur between both electrodes of the ferroelectric of the memory cell. As shown in FIGS. 6A and 6B, the wake-up puke applied during the recovery operation may have a puke amplitude substantially equal to or smaller than that of the driving voltage applied during the normal operation. In addition, the puke holding period 12 of the wake-up pulse may have a puke width wider than that of the driving voltage applied during the normal operation.

Figure 6C:
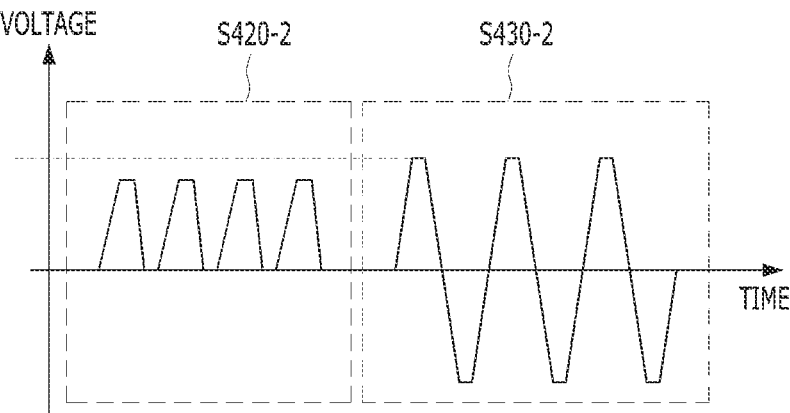
Figure 6D:
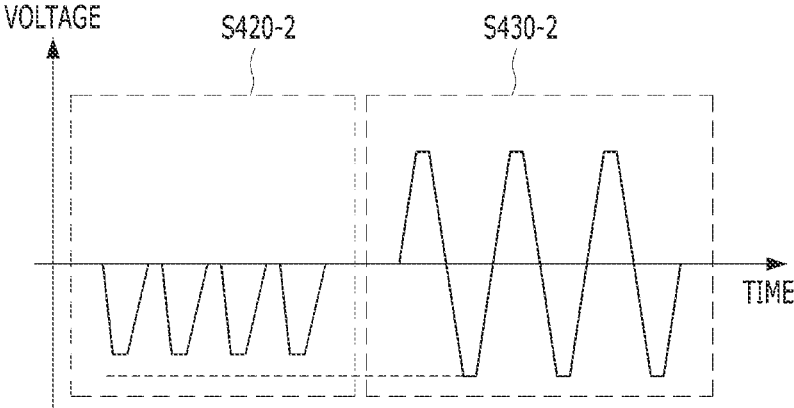

Referring to FIGS. 6C and 6D, a multiple-time unipolar wake-up pulse may be applied to a memory cell as a recovery voltage in a recovery operation (at S420-2). In this case, a positive or negative potential difference may occur between both electrodes of the ferroelectric in the memory cell. The number of pulses of the wake-up pulse may be determined according to a pulse width (i.e., a pulse holding period T2) of the one-time unipolar wake-up pulse of FIGS. 6A and 6B.

Thereafter, in the normal operation (at S430-2), a read or write operation may be performed using a driving voltage such as a high voltage VPP, a power voltage VDD, a core voltage VCORE, a bit line precharge voltage VBLP, a ground voltage VSS, and a low voltage VBB. Accordingly, a positive or negative potential difference may occur between both electrodes of the ferroelectric of the memory cell. As shown in FIGS. 6C and 6D, the wake-up pulse applied during the recovery operation may have a pulse amplitude substantially equal to or smaller than that of the driving voltage applied during the normal operation.

As described above, in the embodiment of the proposed invention, the amplitude of the potential difference between both electrodes of the ferroelectric in the recovery operation may be substantially equal to or lower than that of the potential difference between both electrodes of the ferro-electric in the normal operation. Accordingly, the power consumption due to the recovery operation may be minimized, and since a separate voltage generation circuit for generating a voltage equal to or higher than the driving voltage is not required, an improvement in integration of a memory device may be expected.

Figure 7:
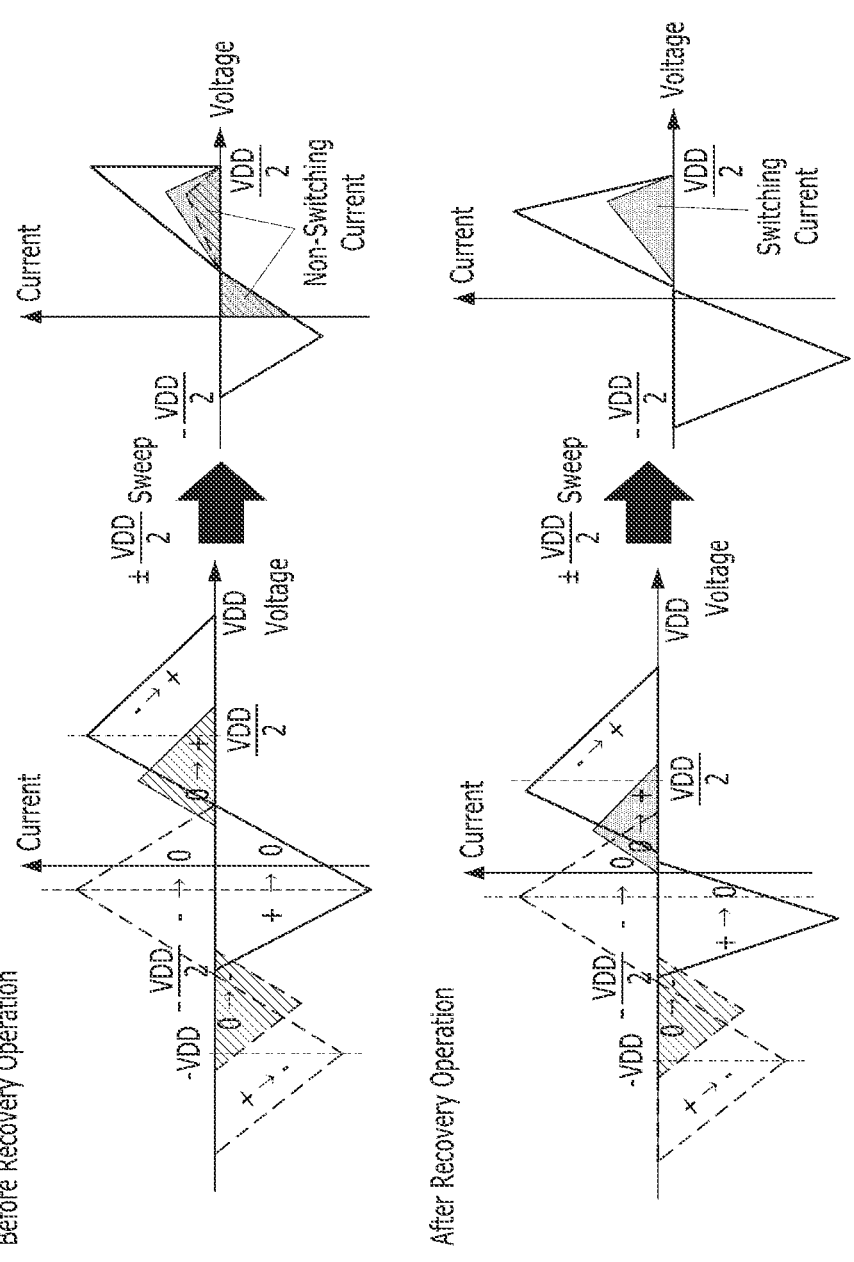
FIG. 7 is an I-V graph timing for describing polarization characteristics of a ferroelectric by a recovery operation according to an embodiment of the present invention.

FIG. 7 is an I-V graph timing for describing polarization characteristics of a ferroelectric by a recovery operation according to an embodiment of the present invention.

Referring to FIG. 7, it may be seen that as a unipolar wake-up pulse is applied in a recovery operation, a peak current related to an up-state is shifted to the left, thereby increasing a reactive polarization ranging from 0 to VDD/2. In particular, it may be seen that a current from an up-state to a non-polar state "0" is mostly generated only at a negative bias, and thus a non-switching current is reduced. As described above, while the two phenomena act in combination, the polarization may increase by about twice or more.

Therefore, the ferroelectric memory device according to an embodiment of the present invention may use more charges as up-state polarization available within a driving voltage range increases, thereby increasing durability and data retention time of the device. In addition, by securing the desired capacitor capacity even in the ferroelectric memory device with thinner dielectric, the burden on the process may be reduced and mass productivity may be further secured.

Hereinafter, a recovery operation according to an embodiment of the present invention will be described in detail.

Figures 8, 9:
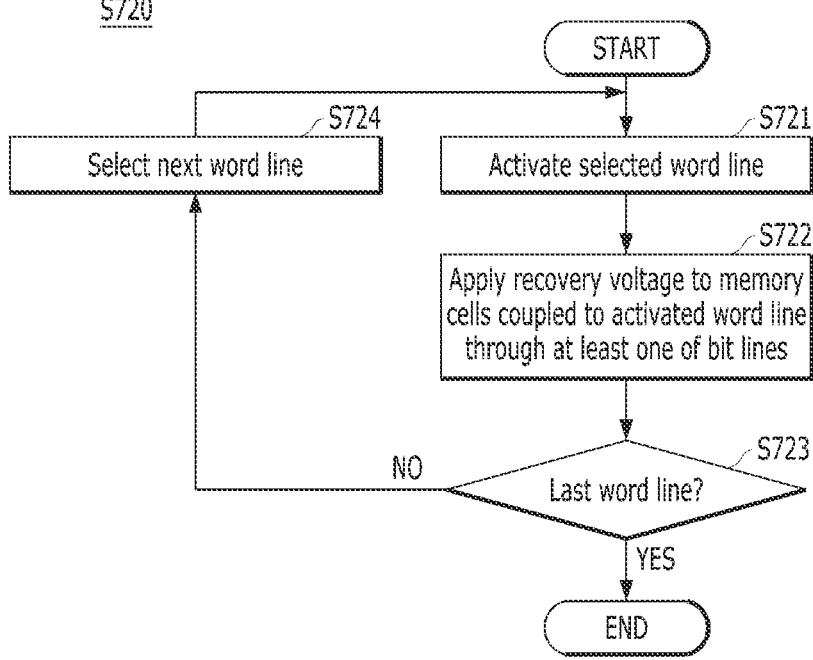
FIGS. 8 and 9 are flow charts for describing a recovery operation in accordance with an embodiment of the present invention.

FIGS. 8 and 9 are flow charts for describing a recovery operation of the memory device 100 in accordance with an embodiment of the present invention.

Referring to FIG. 8, the memory device 100 may perform a backup operation of writing data previously stored in the memory cells MC of the memory cell array 110 to spare cells of another memory cell array (at S710). The backup operation may be performed to back up the data previously stored in the memory cells MC during a recovery voltage application operation (at S720) to be performed later. During the backup operation, the data previously stored in the memory cells MC may be read through a read operation, and the read data may be written to the spare cells of another memory cell array through a write operation.

When the backup operation is completed, the memory device 100 may perform the recovery voltage application operation of applying a recovery voltage to the ferroelectric of the memory cells MC through bit lines (at S720).

More specifically, referring to FIG. 9, the control logic 130 may provide the row address RADD together with the active command ACT to the row control circuit 121. The row control circuit 121 may select a specific word line (e.g., a first word line) according to the row address RADD and activate the selected word line according to the active command ACT (at S721). The row control circuit 121 may apply a high voltage VPP higher than the power supply voltage (VDD) level to the selected word line to activate the selected word line.

In the recovery operation, the control logic 130 may provide the sensing control signal SAEN and the wake-up signal WU_EN to the sense amplification circuit 123. Each of the bit line sense amplification circuits 123 may sense and amplify a voltage difference between the bit lines BL and BLB of the memory cells MC coupled to the activated word line in response to the sensing control signal SAEN, In particular, in an embodiment of the present invention, each of the bit line sense amplifiers may apply the recovery voltage to the memory cells MC coupled to the activated word line through at least one of the bit line BL and the complementary bit line BLB in response to the wake-up signal WU_EN (at S722). In this case, the column control circuit 125 may sequentially increase the column address CADD until the column address CADD becomes all-high bits, and provide the column address CADD to the column control circuit 125, Accordingly, each of the bit line sense amplifiers may apply the recovery voltage to the memory cells MC coupled to the activated word line. According to an embodiment, the recovery voltage may be applied only to selected memory cells without applying the recovery voltage to all memory cells coupled to the activated word line.

After the operation at S722 is performed on the memory cells MC coupled to the activated word line, the control logic 130 may select the next word line by providing the row address RADD together with the active command ACT to the row control circuit 121, Likewise, the row control circuit 121 may select a next word line (e.g., a second word line) according to the row address RADD and activate the selected word line according to the active command ACT (at S721). Each of the bit line sense amplifiers may apply the recovery voltage to memory cells MC coupled to the active word line through at least one of the bit line BL and the complementary bit line BLB in response to the wake-up signal WU_EN (at S722).

Until the activated word line reaches the last word line ("NO" of S723), the peripheral circuit 120 may repeatedly perform the above operations S721 to 723, and thus the recovery voltage may be applied to the ferroelectric of the memory cells MC through the bit lines BL and BLB.

Referring back to FIG. 8, the memory device 100 may perform a write-back operation of writing original data backed up to the spare cells of another memory cell array back to the memory cells MC of the memory cell array 110 (at S730). During the write-back operation, the data previously stored in the spare cells of another memory cell array may be read through a read operation, and the read data may be written to the memory cells MC of the memory cell array 110 through a write operation.

Accordingly, the recovery operation of the memory device 100 may be completed.

Hereinafter, a detailed configuration of the sense amplification circuit 123 for performing a recovery operation according to an embodiment of the present invention will be discussed. In the following embodiments, a case where bit line sense amplifiers receive a power supply voltage VDD and a ground voltage VSS as operating voltages will be described as an embodiment.

Figure 10:
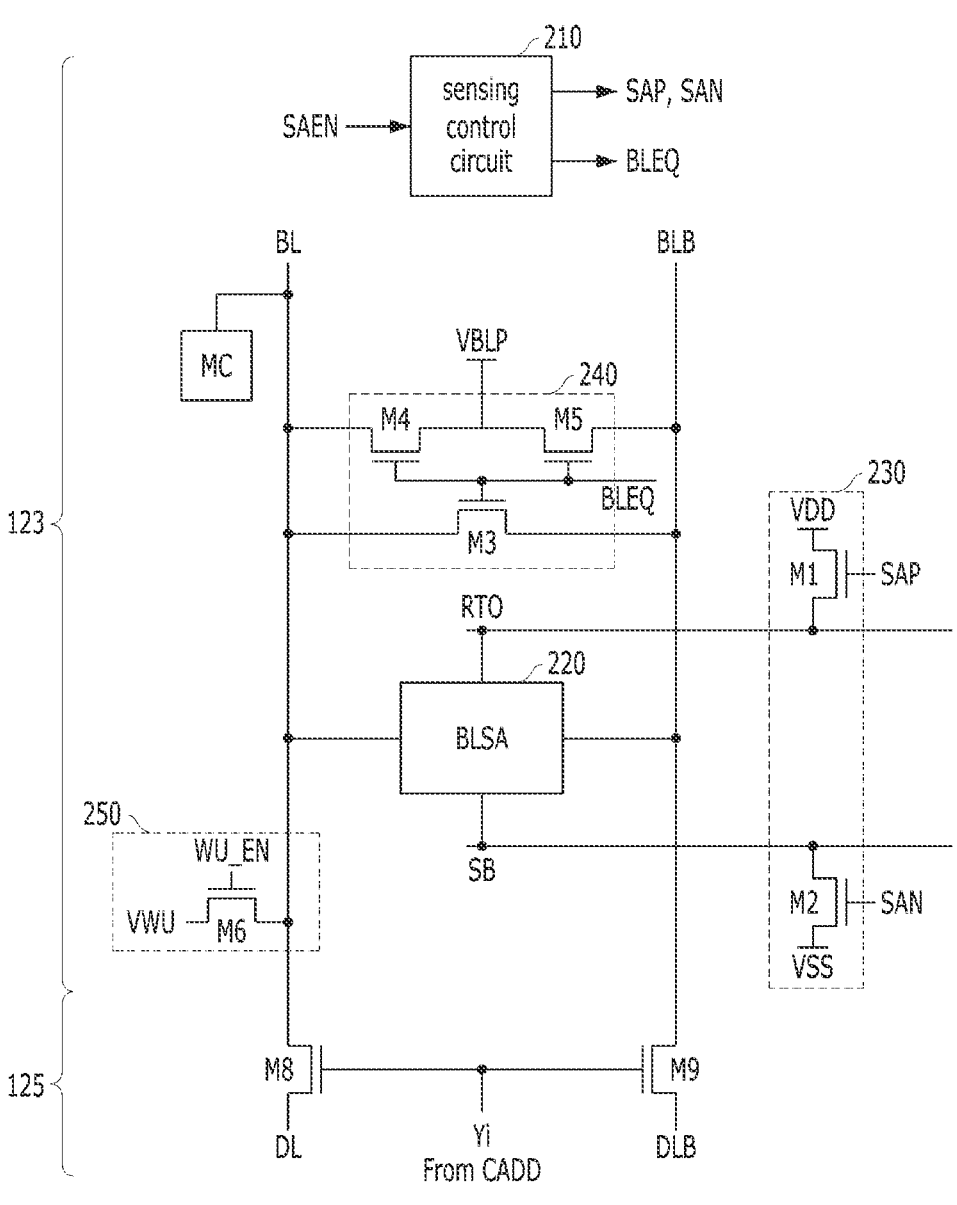
FIG. 10 is a circuit diagram illustrating a sense amplifying circuit for performing a recovery operation in accordance with a first embodiment of the present invention.

FIG. 10 is a circuit diagram illustrating the sense amplifying circuit 123 for performing a recovery operation in accordance with a first embodiment of the present invention. In FIG. 10, configurations of the sense amplification circuit 123 and the column control circuit 125 coupled to one bit line pair BL and BLB are illustrated.

Referring to FIG. 10, the sense amplification circuit 123 may include a sensing control circuit 210, a bit line sense amplifier (BLSA) 220, a voltage supply circuit 230, a precharge circuit 240, and a recovery bias circuit 250.

The sensing control circuit 210 may generate a pull-up control signal SAP, a pull-down control signal SAN, and an equalization signal BLEQ in response to the sensing control signal SAEN, The sensing control circuit 210 may activate the pull-up control signal SAP and the pull-down control signal SAN according to activation of the sensing control signal SAEN, and may deactivate the pull-up control signal SAP and the pull-down control signal SAN according to deactivation of the sensing control signal SAEN. In addition, the sensing control circuit 210 may deactivate the equalization signal BLEQ according to activation of the sensing control signal SAEN and activate the equalization signal BLEQ according to deactivation of the sensing control signal SAEN.

The bit line sense amplifier 220 may sense and amplify data of the bit lines BL and BLB using a pull-up driving voltage supplied to a pull-up power line RTO and a pull-down driving voltage supplied to a pull-down power line SB. When the word line WL is activated, data stored in the memory cell MC connected to the activated word line is transferred to the bit line BL, and the bit line sense amplifier 220 may sense and amplify the data of the memory cell MC transmitted through the bit lines BL. The bit line sense amplifier 220 may be configured as an amplification circuit implemented with a cross-coupled latch including a plurality of PMOS transistors (e.g., a pair of PMOS transistors) and a plurality of NMOS transistors (e.g., an NMOS transistor pair). The bit line sense amplifier 220 may sense and amplify a voltage difference between the bit lines BL and BLB connected to its differential input terminals by using the pull-up driving voltage supplied to the pull-up power line RTO and the pull-down driving voltage supplied to the pull-down power line SB.

The voltage supply circuit 230 may supply the power supply voltage VDD as the pull-up driving voltage to the pull-up power line RTO in response to the pull-up control signal SAP, and supply the ground voltage VSS as the pull-down driving voltage to the pull-down power line SB in response to the pull-down control signal SAN. For example, the voltage supply circuit 230 may include a first transistor M1 that is coupled between a power supply voltage (VDD)

terminal and the pull-up power line RTO and receives the pull-up control signal SAP at a gate thereof, and a second transistor M2 that is coupled between a ground voltage (VSS) terminal and the pull-down power line SB and receives the pull-down control signal SAN at a gate thereof.

The precharge circuit 240 may precharge the bit line BL and the complementary bit line BLB with the bit line precharge voltage VBLP in response to the equalization signal BLEQ, Preferably, the bit line precharge voltage VBLP may be a half level VDD/2 of the power supply voltage VDD. For example, the precharge circuit 240 may have a third transistor M3 coupled between the bit line BL and the complementary bit line BLB, a fourth transistor M4 coupled between the bit line BL and a bit line precharge voltage (VBLP) terminal, and a fifth transistor M5 coupled between the bit line precharge voltage (VBLP) terminal and the complementary bit line BLB, wherein the third to fifth transistors M3 to M5 may receive the equalization signal BLEQ with gates.

The recovery bias circuit 250 may apply a recovery voltage VWU to the bit line BL according to the wake-up signal WU_EN. For example, the recovery bias circuit 250 may include a sixth transistor M6 that is coupled between the bit line BL and a recovery voltage (VWU) terminal and receives the wake-up signal WU_EN at a gate thereof. Preferably, the recovery voltage VWU may have a level greater than or less than a predetermined level from the bit line precharge voltage VBLP. In this case, the predetermined level may correspond to a minimum voltage difference between the bit line BL and the complementary bit line BLB through which the bit line sense amplifier 220 may sense and amplify the data.

The column control circuit 125 may include a column decoder (not shown) that decodes the column address CADD to generate a column selection signal Yi. In addition, the column control circuit 125 may further include an eighth transistor M8 that is coupled between the bit line BL and a data line DL and receives the column selection signal Yi at a gate thereof, and a ninth transistor M9 that is coupled between the complementary bit line BLB and a complementary data line DLB and receives the column selection signal Yi at a gate thereof.

Moreover, in the case of the sense amplification circuit 123 of FIG. 10, the memory cells MC of the memory cell array 110 may share a common plate. That is, as shown in FIG. 3A, each of the memory cells MC may include the ferroelectric capacitor C1 having the first electrode coupled to the common plate, and the access transistor T1 coupled between the bit line BL and the second electrode of the ferroelectric capacitor C1 and including the gate coupled to the word line WL.

Figure 11A:
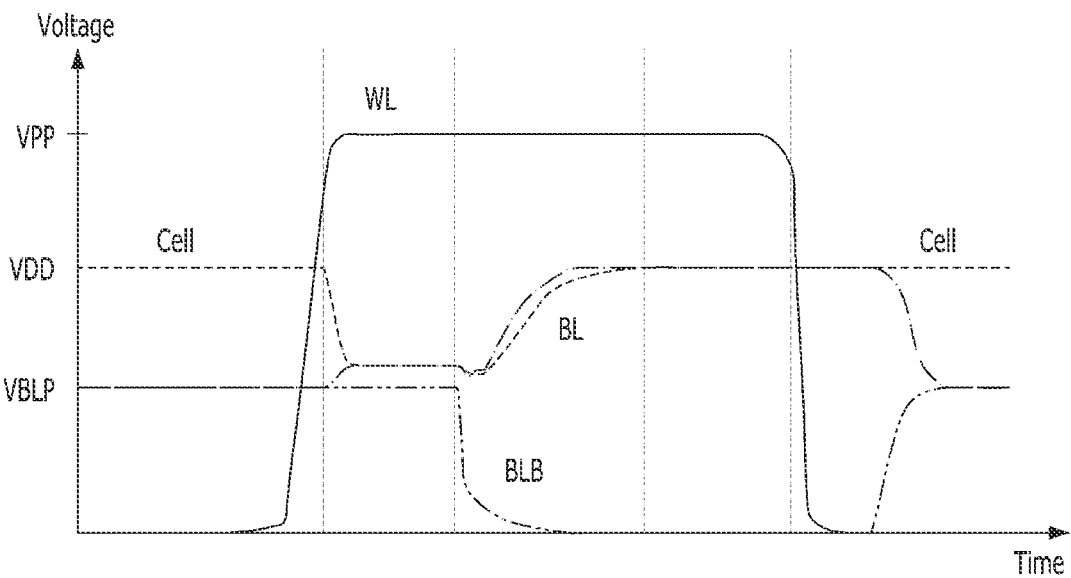
FIGS. 11A to 11C are waveforms for describing the recovery operation by the sense amplifying circuit of FIG. 10 in accordance with the first embodiment of the present invention.
Figure 11B:
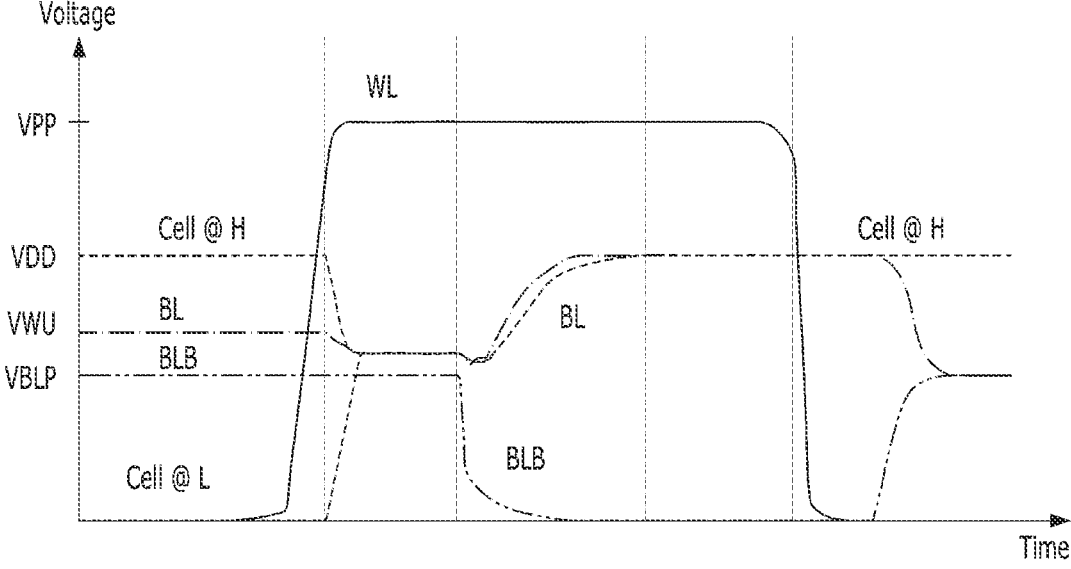
Figure 11C:
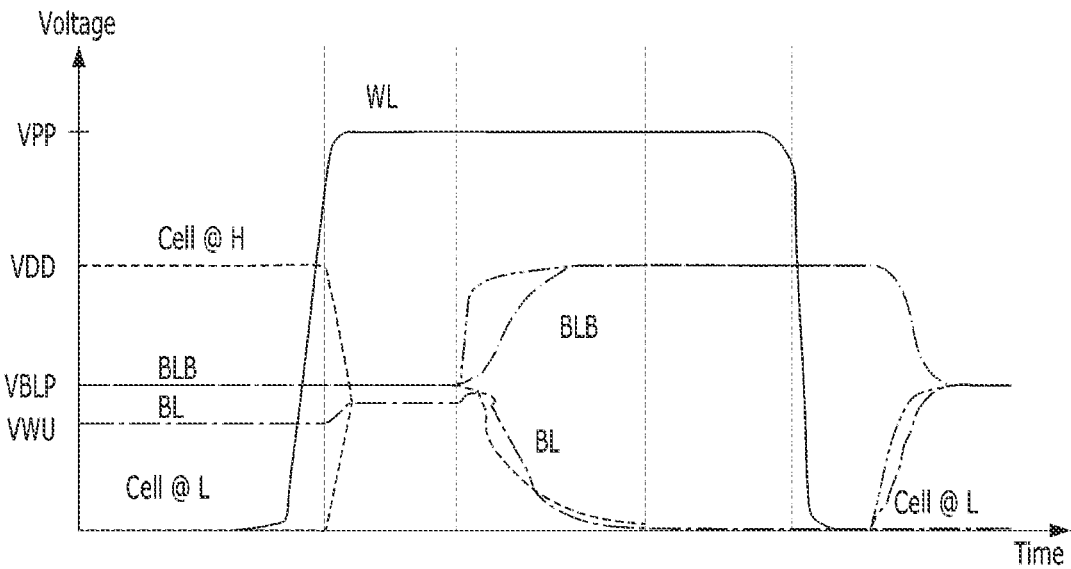

FIGS. 11A to 11C are waveforms for describing the recovery operation by the sense amplifying circuit 123 of FIG. 10 in accordance with an embodiment of the present invention.

Referring to FIG. 11A, a general bit line sensing operation is described.

Before the bit line sensing operation, the equalization signal BLEQ is activated to a logic high level, and accordingly, the bit line BL and the complementary bit line BLB are precharged with the bit line precharge voltage VBLP. During an initial period of the bit line sensing operation, the word line WL is activated as the high voltage VPP is applied. Charge sharing occurs between the bit line BL and the complementary bit line BLB, resulting in a fine voltage difference. Thereafter, as the power voltage VDD and the ground voltage VSS are respectively applied to the pull-up power line RTO and the pull-down power line SB, the bit line sense amplifier 220 may sense and amplify a voltage difference between the bit line BL and the complementary bit line BLB. As a result, the bit line BL reaches a power supply voltage (VDD) level, and the complementary bit line BLB becomes a ground voltage (VSS) level, so that data of a logic high level may be written to the memory cell MC.

Referring to FIG. 11B, a case in which the recovery voltage VWU greater than the bit line precharge voltage VBLP, that is, a half level VDD/2 of the power supply voltage VDD, is applied is illustrated.

Before the recovery operation, the equalization signal BLEQ is activated to a logic high level, and accordingly, the bit line BL and the complementary bit line BLB are pre-charged with the bit line precharge voltage VBLP. In the recovery operation, as the wake-up signal WU_EN is acti-vated, the recovery bias circuit 250 may apply the recovery voltage VWU having a voltage level greater than that of the bit line precharge voltage VBLP to the bit line BL. There-after, the word line WL is activated as the high voltage VPP is applied. Charge sharing occurs between the bit line BL and the complementary bit line BLB, resulting in a fine voltage difference. Thereafter, as the power voltage VDD and the ground voltage VSS are respectively applied to the pull-up power line RTO and the pull-down power line SB, the bit line sense amplifier 220 may sense and amplify a voltage difference between the bit line BL and the comple-mentary bit line BLB.

That is, when the recovery voltage VWU is greater than the bit line precharge voltage VBLP, regardless of whether the data previously stored in the memory cell MC is a logic high level or a low level, data of a logic high level may be written to the memory cell MC as the recovery voltage VWU is applied to the bit line BL. Although FIG. 11B shows a case in which the wake-up signal WU_EN pulses once, the proposed invention is not limited thereto. As the wake-up signal WU_EN is pulsing a predetermined number of times, the recovery voltage VWU may be repeatedly applied to the memory cell MC through the bit line BL. For reference, when the recovery voltage VWU greater than the bit line precharge voltage VBLP is applied, as shown in FIGS. 6A and 6C, a positive potential difference may occur between both electrodes of the ferroelectric of the memory cell MC during the recovery operation.

Referring to FIG. 11C, a case in which the recovery voltage VWU lower than the bit line precharge voltage VBLP, that is, a half level VDD/2 of the power supply voltage VDD, is applied is illustrated.

Before the recovery operation, the equalization signal BLEQ is activated to a logic high level, and accordingly, the bit line BL and the complementary bit line BLB are pre-charged with the bit line precharge voltage VBLP. In the recovery operation, as the wake-up signal WU_EN is acti-vated, the recovery bias circuit 250 may apply the recovery voltage VWU having a voltage level lower than that of the bit line precharge voltage VBLP to the bit line BL. There-after, the word line WL is activated as the high voltage VPP is applied. Charge sharing occurs between the bit line BL and the complementary bit line BLB, resulting in a fine voltage difference. Thereafter, as the power voltage VDD and the ground voltage VSS are respectively applied to the pull-up power line RTO and the pull-down power line SB, the bit line sense amplifier 220 may sense and amplify a voltage difference between the bit line BL and the comple-mentary bit line BLB.

That is, when the recovery voltage VWU is greater than the bit line precharge voltage VBLP, regardless of whether the data previously stored in the memory cell MC is a logic high level or a low level, data of a logic low level may be written to the memory cell MC as the recovery voltage VWU is applied to the bit line BL. Although FIG. 11C shows a case in which the wake-up signal WU_EN pulses once, the proposed invention is not limited thereto. As the wake-up signal WU_EN is pulsing a predetermined number of times, the recovery voltage VWU may be repeatedly applied to the memory cell MC through the bit line BL. For reference, when the recovery voltage VWU lower than the bit line precharge voltage VBLP is applied, as shown in FIGS. 6B and 6D, a negative potential difference may occur between both electrodes of the ferroelectric of the memory cell MC during the recovery operation.

Figure 12:
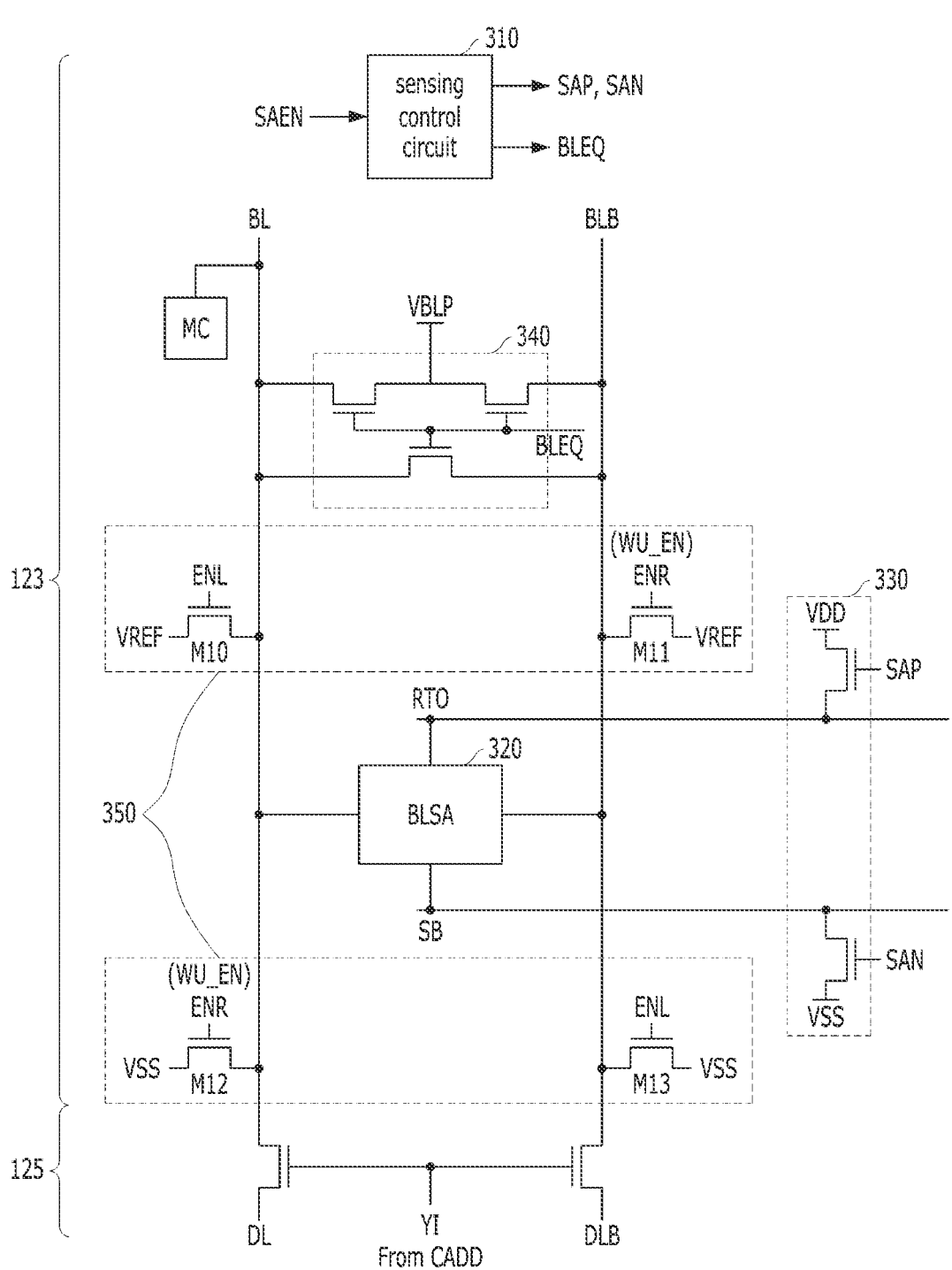
FIG. 12 is a circuit diagram illustrating a sense amplifying circuit for performing a recovery operation in accordance with a second embodiment of the present invention.

FIG. 12 is a circuit diagram illustrating the sense ampli-fying circuit 123 for performing a recovery operation in accordance with a second embodiment of the present inven-tion. In FIG. 12, configurations of the sense amplification circuit 123 and the column control circuit 125 coupled to one bit line pair BL and BLB are illustrated.

Referring to FIG. 12, the sense amplification circuit 123 may include a sensing control circuit 310, a bit line sense amplifier (BLSA) 320, a voltage supply circuit 330, a precharge circuit 340, and a recovery bias circuit 350. Since the sensing control circuit 310, the bit line sense amplifier 320, the voltage supply circuit 330, and the precharge circuit 340 of FIG. 12 are substantially the same as those of FIG. 10, detailed descriptions thereof will be omitted.

The sense amplification circuit 123 of FIG. 12 may be applied to a scheme for performing a bit line sensing operation by using a reference voltage VREF having a voltage level between the bit line precharge voltage VBLP and the ground voltage VSS. The recovery bias circuit 350 may receive a first control signal ENL for charging the bit line BL with the reference voltage VREF, and a second control signal ENR for charging the complementary bit line BLB with the reference voltage VREF. For example, the first control signal ENL and the second control signal ENR may be additionally provided from the control logic 130 of FIG. 2.

The recovery bias circuit 350 may include tenth to thir-teenth transistors M10 to M13, The tenth transistor M10 may be coupled between the bit line BL and a reference voltage (VREF) terminal and receive the first control signal ENL at a gate thereof. The eleventh transistor M11 may be coupled between the complementary bit line BLB and the reference voltage (VREF) terminal and receive the second control signal ENR at a gate thereof. The twelfth transistor M12 may be coupled between the bit line BL and the ground voltage (VSS) terminal and receive the second control signal ENR at a gate thereof. The thirteenth transistor M13 may be coupled between the complementary bit line BLB and the ground voltage (VSS) terminal and receive the first control signal ENL at a gate thereof.

In the above configuration, in the normal operation, the recovery bias circuit 350 may charge the bit line BL to the reference voltage VREF in response to the first control signal ENL and discharge the complementary bit line BLB to the ground voltage VSS. In addition, the recovery bias circuit 350 may charge the complementary bit line BLB to the reference voltage VREF in response to the second control signal ENR and discharge the bit line BL to the ground voltage VSS. In the normal operation, the reference voltage VREF may have a voltage level between the bit line precharge voltage VBLP and the ground voltage VSS.

In the second embodiment of the present disclosure, the recovery bias circuit 350 may receive the wake-up signal WU_EN as the second control signal ENR during the recovery operation. When the wake-up signal WU_EN is activated during the recovery operation, the eleventh transistor M11 may be turned on to apply the reference voltage VREF to the complementary bit line BLB, and the twelfth transistor M12 may be turned on to apply the ground voltage VSS to the bit line BL. In this case, the reference voltage VREF and the ground voltage VSS may be used as the recovery voltage. That is, the recovery bias circuit 350 may apply the reference voltage VREF to the complementary bit line BLB according to the wake-up signal WU_EN and apply the ground voltage VSS to the bit line BL, In the recovery operation, the reference voltage VREF may have the power supply voltage (VDD) level or the ground voltage (VSS) level.

In the case of the sense amplification circuit 123 of FIG. 12, the memory cells MC of the memory cell array 110 may have independent plates but may have an array shape coupled through a plate line PL. That is, as illustrated in FIG. 3B, each memory cell MC may include the ferroelectric capacitor C2 including the first electrode coupled to the plate line PL, and the access transistor 12 coupled between the second electrode of the ferroelectric capacitor C2 and the bit line BL and having a gate coupled to a word line WL.

Figure 13A:
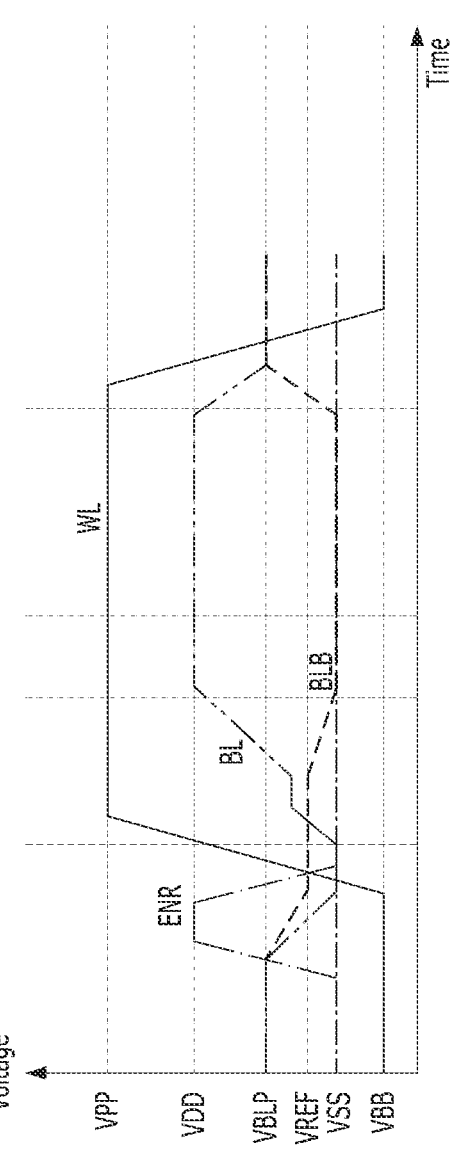
FIGS. 13A to 13C are waveforms for describing the recovery operation by the sense amplifying circuit of FIG. 12 in accordance with the second embodiment of the present invention.
Figure 13B:
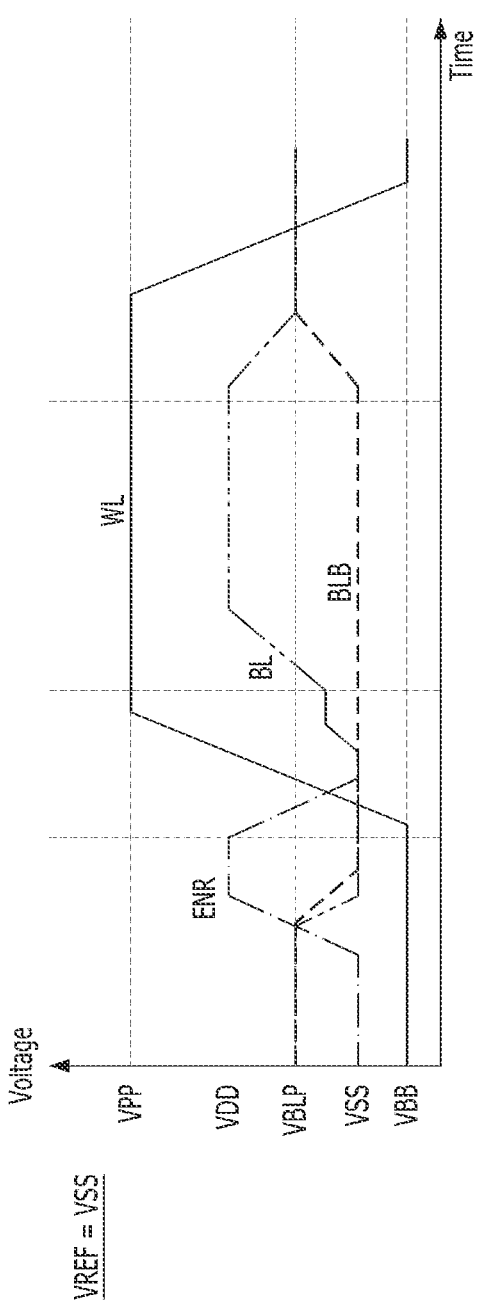
Figure 13C:
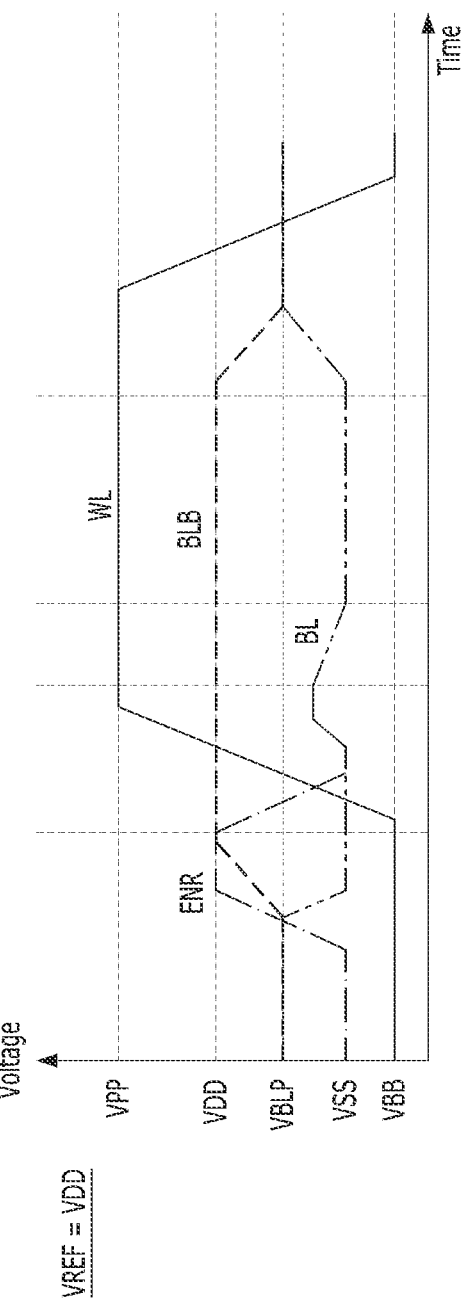

FIGS. 13A to 13C are waveforms for describing the recovery operation by the sense amplifying circuit 123 of FIG. 12 in accordance with an embodiment of the present invention.

Referring to FIG. 13A, a general bit line sensing operation is described.

Before the bit line sensing operation, the equalization signal BLEB is activated to a logic high level, and accordingly, the bit line BL and the complementary bit line BLB are precharged with the bit line precharge voltage (VBLP). During an initial period of the bit line sensing operation, when the second control signal ENR is activated before the word line WL is activated, the eleventh transistor M11 may be turned on to apply the reference voltage VREF to the complementary bit line BLB, and the twelfth transistor M12 may be turned on to apply the ground voltage VSS to the bit line BL. In this case, the reference voltage VREF may have a voltage level between the bit line precharge voltage VBLP and the ground voltage VSS.

Thereafter, when the word line WL is activated as the high voltage VPP is applied, the charge in the memory cell MC is transmitted through the bit line BL, and the voltage of the bit line BL is at a level greater than the voltage of the complementary bit line BLB. Accordingly, charge sharing occurs between the bit line BL and the complementary bit line BLB, thereby generating a fine voltage difference. As the power voltage VDD and the ground voltage VSS are respectively applied to the pull-up power line RTO and the pull-down power line SB, the bit line sense amplifier 320 may sense and amplify a voltage difference between the bit line BL and the complementary bit line BLB. As a result, the bit line BL reaches the power supply voltage (VDD) level, and the complementary bit line BLB becomes the ground voltage (VSS) level, so that data of a logic high level may be written to the memory cell MC.

Referring to FIG. 13B, it is illustrated that the reference voltage VREF is set to the ground voltage (VSS) level, and thus the bit line BL is always sensed only at the power voltage (VDD) level during a recovery operation.

Before the recovery operation, the equalization signal BLEQ is activated to a logic high level, and accordingly, the bit line BL and the complementary bit line BLB are precharged with the bit line precharge voltage VBLP.

In the recovery operation, as the second control signal ENR is activated, the recovery bias circuit 350 may apply the ground voltage VSS to the bit line BL and the reference voltage VREF of the ground voltage (VSS) level to the complementary bit line BLB. Thereafter, when the word line WL is activated as the high voltage VPP is applied, the charge in the memory cell MC is transferred through the bit line BL, and the voltage of the bit line BL becomes a level higher than the voltage of the complementary bit line BLB by a predetermined level. Accordingly, charge sharing occurs between the bit line BL and the complementary bit line BLB, thereby generating a fine voltage difference. Thereafter, as the power voltage VDD and the ground voltage VSS are respectively applied to the pull-up power line RTO and the pull-down power line SB, the bit line sense amplifier 320 may sense and amplify a voltage difference between the bit line BL and the complementary bit line BLB.

That is, as the reference voltage VREF of the ground voltage (VSS) level is applied to the complementary bit line BLB, data of a logic high level may be written to the memory cell MC. Although FIG. 13A illustrates a case in which the second control signal ENR pulses once, the proposed embodiment is not limited thereto. As the second control signal ENR is pulsed a predetermined number of times, data of a logic high level may be repeatedly written to the memory cell MC.

Referring to FIG. 13C, it is illustrated that the reference voltage VREF is set to the power voltage (VDD) level, and thus the bit line BL is always sensed only at the ground voltage (VSS) level during a recovery operation.

Before the recovery operation, the equalization signal BLEQ is activated to a logic high level, and accordingly, the bit line BL and the complementary bit line BLB are precharged with the bit line precharge voltage VBLP.

In the recovery operation, as the second control signal ENR is activated, the recovery bias circuit 350 may apply the ground voltage VSS to the bit line BL and the reference voltage VREF of the power voltage (VDD) level to the complementary bit line BLB. Accordingly, the bit line BL is lowered to the ground voltage (VSS) level, and the complementary bit line BLB is raised to the power voltage (VDD) level. Thereafter, when the word line WL is activated as the high voltage VPP is applied, the bit line BL has a lower voltage level than the complementary bit line BL even if the charge in the memory cell MC is transmitted through the bit line BL. Thereafter, as the power voltage VDD and the ground voltage VSS are respectively applied to the pull-up power line RTO and the pull-down power line SB, the bit line sense amplifier 320 may sense and amplify a voltage difference between the bit line BL and the complementary bit line BLB.

That is, as the reference voltage VREF of the power voltage (VDD) level is applied to the complementary bit line BLB, data of a logic low level may be written to the memory cell MC, Although FIG. 13B illustrates a case in which the second control signal ENR pulses once, the proposed invention is not limited thereto. As the second control signal ENR is pulsed a predetermined number of times, data of a logic low level may be repeatedly written to the memory cell MC.

In the first and second embodiments, a method of using the sense amplification circuit 123 to apply the recovery voltage to the memory cell through a bit line has been described as an example. Hereinafter, a recovery operation using a test pattern input from an external test device during a burn-in test operation will be described.

A performance degradation may occur due to various factors such as variation in a process of a semiconductor memory device or variation in signals provided to various circuits for operating the semiconductor memory device. Accordingly, the semiconductor memory device may test manufacturing defects or inconsistencies in design and function through a burn-in test in a wafer state. When entering the wafer burn-in test mode, the memory device may simultaneously turn on cell transistors of the memory cells, write a test pattern provided from the external test device to all memory cells, and read data from the memory cells to check whether the memory device operates normally within a short time.

Figure 14:
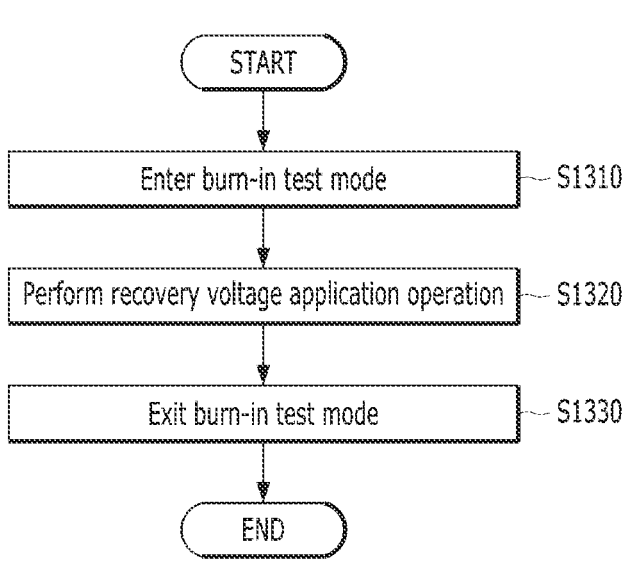
FIGS. 14 and 15 are flow charts for describing a recovery operation in accordance with a third embodiment of the present invention.
Figure 15:
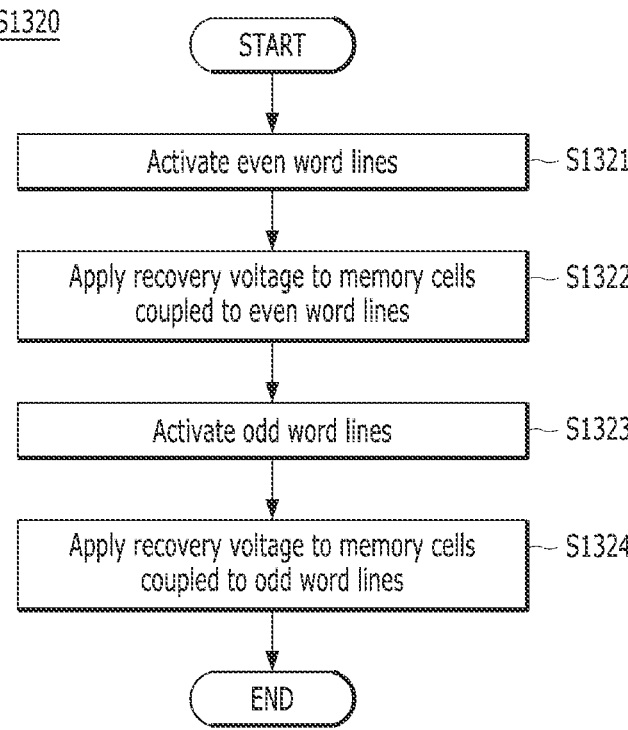

FIGS. 14 and 15 are flow charts for describing a recovery operation in accordance with a third embodiment of the present invention.

Referring to FIG. 14, the memory device 100 may enter a burn-in test mode (at S1310), In order to enter the burn-in test mode, a test mode signal may be provided from an external test device to the control logic 130 of the memory device 100, or a test mode signal may be generated in the control logic 130.

When entering the burn-in test mode, the control logic 130 may provide the row address RADD and the active command ACT to the row control circuit 121, provide the sensing control signal SAEN to the sense amplification circuit 123, and provide the column address CADD to the column control circuit 125, for selecting the memory cells MC. In addition, the control logic 130 may provide the write command WT to the data input/output circuit 127 for receiving a test pattern provided from the external test device. Also, when entering the burn-in test mode, the control logic 130 may control the row control circuit 121 such that a plate voltage different from the normal operation is applied to a plate line or a common plate, or a source voltage different from the normal operation is applied to a source line.

The memory device 100 may perform a recovery voltage application operation of applying a recovery voltage to the ferroelectric of the memory cells MC through the bit lines BL (at S1320). During the recovery voltage application operation, the control logic 130 may control the peripheral circuit 120 such that the test pattern input from the external test device is written to the memory cells MC. For example, the row control circuit 121 may select and activate the word lines WL according to the row address RADD and the active command ACT, and the column control circuit 125 may couple the bit lines BL to the data line DL according to the column address CADD, and the sense amplification circuit 123 may write the test pattern input through the bit lines BL to the memory cells MC according to the memory lines SAEN. Preferably, by writing the test pattern of all-high data or all-low data, the recovery operation of applying a unipolar wake-up pulse to the memory cells MC may be performed.

After the recovery voltage application operation is performed, the memory device 100 may terminate the recovery operation by exiting the burn-in test mode (at S1330).

According to an embodiment, in the burn-in test mode, the memory device 100 may divide a plurality of word lines WL into even word lines and odd word lines, write a test pattern to the memory cells MC coupled to the odd word lines after writing the test pattern to the memory cells MC coupled to the even word lines.

Referring to FIG. 15, the row control circuit 121 may select and activate even word lines by applying a high voltage (VPP) level to the even word lines (at S1321), and the sense amplification circuit 123 may apply a recovery voltage to the memory cells MC through the bit lines BL by transmitting a test pattern through the data line DL to the bit lines BL to thereby write all-high data or all-low data into all memory cells MC coupled to the even word lines (at S1322). Accordingly, a recovery operation of applying a unipolar wake-up pulse to the memory cells MC coupled to the even word lines may be performed. For example, in the recovery operation, the bit line precharge voltage VBLP may be set to a level lower than a half level VDD/2, and the plate voltage or the source voltage may be set to a power voltage (VDD) level. In this situation, when all-high data or all-low data are applied to the bit lines after the high voltage VPP is applied to the even word lines, a stress greater than the normal operation may be applied to the half of the memory cells MC.

Subsequently, the row control circuit 121 may select and activate odd word lines by applying the high voltage (VPP) level to the odd word lines (at S1323), and the sense amplification circuit 123 may apply the recovery voltage to the memory cells MC through the bit lines BL by transmitting the test pattern through the data line DL to the bit lines BL to thereby write all-high data or all-low data into all memory cells MC coupled to the odd word lines (at S1324). Accordingly, a recovery operation of applying a unipolar wake-up pulse to the memory cells MC coupled to the odd word lines may be performed. For example, in the recovery operation, the bit line precharge voltage VBLP may be set to a level lower than the half level VDD/2, and the plate voltage or the source voltage may be set to the power voltage (VDD) level. In this situation, when all-high data or all-low data are applied to the bit lines after the high voltage VPP is applied to the odd word lines, a stress greater than the normal operation may be applied to the other half of the memory cells MC.

Figure 16:
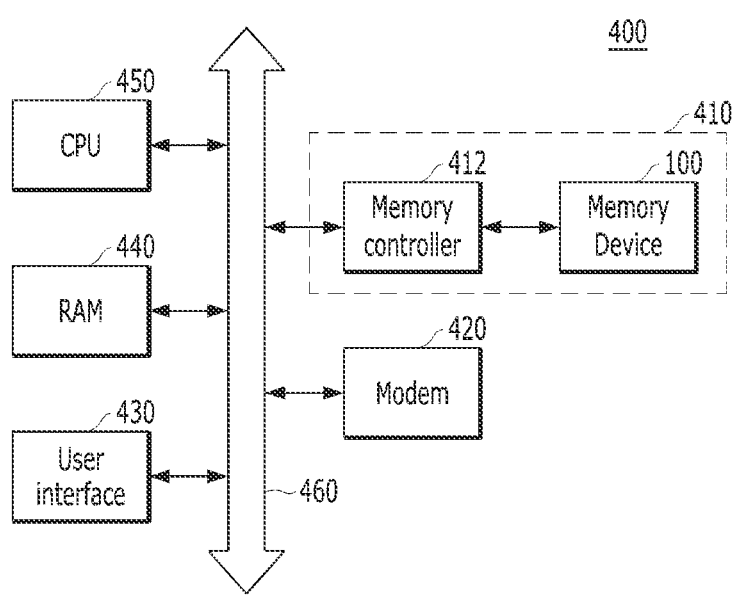
FIG. 16 is a block diagram of an information processing system to which a ferroelectric memory device according to an embodiment of the present invention is applied.

As described above, in the third embodiment of the present disclosure, the normal operation may be performed in a state in which target characteristics may be ensured by performing a recovery operation in advance before the normal operation is performed, FIG. 16 is a block diagram of an information processing system 400 to which a ferroelectric memory device according to an embodiment of the present invention is applied.

Referring to FIG. 16, on the information processing system 400 such as a mobile device or a desktop computer, the memory device 100 or a memory system 410 including the same according to embodiments of the present invention may be mounted. The information processing system 400 may include the memory system 410, a modem 420, a central processing unit 450, a RAM 440, and a user interface 430 electrically coupled to a system bus 460. Also, the memory system 410 may be a nonvolatile memory system including a nonvolatile memory, and for example, the memory system 410 may include the memory device 100 and a memory controller 412, The memory device 100 of FIG. 16 may perform the same configuration and operation as the ferroelectric memory device 100 described in FIGS. 2 to 15.

The memory system 410 may store data processed by the central processing unit 450 or data input from the outside, Although not shown in FIG. 16, the information processing system 400 may further include an application chipset, a camera image processor (CIS), an input/output device, and the like.

Various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made based on the technological scope of the present disclosure in addition to the embodiments disclosed herein. The embodiments may be combined to form additional embodiment.

It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of the disclosure and the following claims.

For example, for the logic gates and transistors provided as examples in the above-described embodiments, different positions and types may be implemented depending on the polarity of the input signal. Furthermore, the embodiments may be combined to form additional embodiments.

What is claimed is:

1. A memory device comprising:
a memory cell array including a plurality of memory cells;
a peripheral circuit configured to perform a recovery operation of applying a recovery voltage to the memory cells for increasing a residual polarization of the memory cells and configured to perform a normal operation of applying a driving voltage to the memory cells for reading data from the memory cells or writing data into the memory cells; and
a control logic configured to control, when powered up, the peripheral circuit to perform the recovery operation and then perform the normal operation,
wherein the peripheral circuit includes:
a recovery bias circuit configured to apply the recovery voltage, having a level greater than or less than a bit line precharge voltage, to one of a bit line and a complementary bit line, according to a wake-up signal provided from the control logic,
wherein the recovery bias circuit includes a transistor coupled between one of the bit line and the complementary bit line and a recovery voltage terminal and receiving the wake-up signal at a gate thereof, and
wherein the residual polarization of the memory cells is increased by application of the recovery voltage comprising a unipolar pulse applied with a non-zero voltage to the memory cells during the recovery operation in which the unipolar pulse is longer in duration than the driving voltage for the reading or the writing of the data and has a magnitude equal to or smaller than that of the driving voltage, and the unipolar pulse is applied in advance of the reading or the writing of the data during the normal operation such that the increased residual polarization in advance of the normal operation compensates for a reduction of the residual polarization during the normal operation.

2. The memory device of claim 1, wherein the recovery voltage has a voltage level substantially equal to or lower than that of the driving voltage.

3. The memory device of claim 1, wherein the recovery voltage includes a unipolar wake-up pulse.

4. The memory device of claim 1,
wherein the recovery voltage includes a one-time unipolar wake-up pulse that is pulsing once with a constant voltage during a recovery operation period, and
wherein the wake-up pulse has a pulse width wider than that of the driving voltage.

5. The memory device of claim 1, wherein the peripheral circuit further includes:
a sense amplifier configured to sense and amplify a voltage difference between the bit line and the complementary bit line.

6. The memory device of claim 1, wherein each of the memory cells includes:
a ferroelectric capacitor including a first electrode coupled to a common plate; and
an access transistor coupled between a second electrode of the ferroelectric capacitor and a bit line and including a gate coupled to a word line.

7. A memory device comprising:
a memory cell array including a plurality of memory cells;
a peripheral circuit configured to perform a recovery operation of applying a recovery voltage to the memory cells for increasing a residual polarization of the memory cells and configured to perform a normal operation of applying a driving voltage to the memory cells for reading data from the memory cells or writing data into the memory cells; and
a control logic configured to control, when powered up, the peripheral circuit to perform the recovery operation and then perform the normal operation,
wherein the peripheral circuit includes:
a recovery bias circuit including a first transistor coupled between a complementary bit line and a first recovery voltage terminal and receiving the wake-up signal at a gate thereof, and a second transistor coupled between a bit line and a second recovery voltage terminal and receiving the wake-up signal at a gate thereof,
wherein a first recovery voltage has a voltage level corresponding to a power supply voltage or the ground voltage, and wherein a second recovery voltage has a voltage level corresponding to a ground voltage, and
wherein the residual polarization of the memory cells is increased by application of the first and second recovery voltages comprising unipolar pulses applied with non-zero voltages to the memory cells during the recovery operation in which the unipolar pulses are each longer in duration than the driving voltage for the reading or the writing of the data and each have a magnitude equal to or smaller than that of the driving voltage, and the unipolar pulses are applied in advance of the reading or the writing of the data during the normal operation such that the increased residual polarization in advance of the normal operation compensates for a reduction of the residual polarization during the normal operation.

8. The memory device of claim 7, wherein each of the memory cells includes:
a ferroelectric capacitor including a first electrode coupled to a plate line; and
an access transistor coupled between a second electrode of the ferroelectric capacitor and a bit line and including a gate coupled to a word line.

* * * * *